US012757354B2

(12) United States Patent
Khan et al.

(10) Patent No.: US 12,757,354 B2
(45) Date of Patent: Oct. 6, 2026

(54) MODULAR VAPOR CHAMBER AND CONNECTION OF SEGMENTS OF MODULAR VAPOR CHAMBER

(71) Applicant: Intel Corporation, Santa Clara, CA (US)

(72) Inventors: Feroze Khan, Bangalore (IN); Arnab Sen, Bangalore (IN); Jeff Ku, Taipei (TW); Samarth Alva, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 147 days.

(21) Appl. No.: 17/955,205

(22) Filed: Sep. 28, 2022

(65) Prior Publication Data

US 2023/0020484 A1 Jan. 19, 2023

(51) Int. Cl.

| | |
|---|---|
| ***H05K 7/20*** | (2006.01) |
| ***G06F 1/20*** | (2006.01) |
| ***H10W 40/22*** | (2026.01) |
| ***H10W 40/73*** | (2026.01) |

(52) U.S. Cl.

CPC ......... *H05K 7/20336* (2013.01); *G06F 1/203* (2013.01); *H05K 7/20436* (2013.01); *H05K 7/20509* (2013.01); *H10W 40/22* (2026.01); *H10W 40/73* (2026.01)

(58) Field of Classification Search

CPC ............. H05K 7/2029; H05K 7/20336; H05K 7/2039; H05K 7/20509; H01L 23/367; H01L 23/427; G06F 1/203

See application file for complete search history.

(56) References Cited

U.S. PATENT DOCUMENTS

| | | | | |
|---|---|---|---|---|
| 10,856,441 | B1 * | 12/2020 | Huang | H05K 7/20727 |
| 11,143,460 | B2 * | 10/2021 | Lin | F28D 15/04 |
| 2019/0103290 | A1 * | 4/2019 | Medina | F28D 15/0275 |
| 2023/0069684 | A1 * | 3/2023 | Kitamura | H05K 7/2039 |
| 2023/0079287 | A1 * | 3/2023 | Kitamura | G06F 1/1669 361/679.09 |
| 2023/0189471 | A1 * | 6/2023 | Hashiba | H05K 7/20154 361/690 |
| 2023/0200013 | A1 * | 6/2023 | Sano | H05K 7/20336 361/689 |
| 2023/0354554 | A1 * | 11/2023 | Lin | H05K 7/20172 |
| 2023/0403823 | A1 * | 12/2023 | Kitamura | G06F 1/1616 |
| 2024/0030097 | A1 * | 1/2024 | Chen | H01L 23/4334 |
| 2024/0098942 | A1 * | 3/2024 | He | G06F 1/1626 |

* cited by examiner

*Primary Examiner* — Jayprakash N Gandhi
*Assistant Examiner* — Steven Ngo
(74) *Attorney, Agent, or Firm* — Banner & Witcoff, Ltd.

(57) ABSTRACT

Particular embodiments described herein provide for a modular vapor chamber and the connection of segments of the modular vapor chamber for an electronic device. In an example, the electronic device can include one or more heat sources and a modular vapor chamber over the one or more heat sources. The modular vapor chamber includes at least two vapor chamber segments and a vapor chamber coupling to couple the at least two vapor chamber segments.

20 Claims, 17 Drawing Sheets

MODULAR VAPOR CHAMBER AND CONNECTION OF SEGMENTS OF MODULAR VAPOR CHAMBER

TECHNICAL FIELD

This disclosure relates in general to the field of computing and/or device cooling, and more particularly, to a modular vapor chamber and the connection of segments of the modular vapor chamber.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
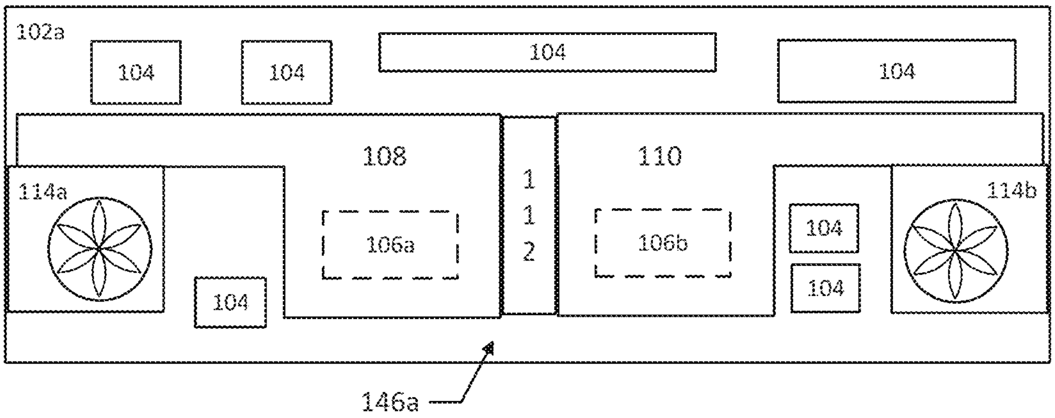
FIGS. 1A-1C are a simplified block diagram of a system to enable a modular vapor chamber and the connection of segments of the modular vapor chamber, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to enabling a modular vapor chamber and the connection of segments of the modular vapor chamber. Features such as structure(s), function(s), and/or characteristic(s), for example, are described with reference to one embodiment as a matter of convenience; various embodiments may be implemented with any suitable one or more of the described features.

In an example, an electronic device can include a modular vapor chamber. The modular vapor chamber includes one or more premade vapor chamber segments. The premade vapor chamber segments can be combined in almost any way and there can be almost any profile or shape of the premade vapor chamber segments, depending on design choice and design constraints. For example, some models of an electronic device have the same chassis as other models of the electronic device but a basic entry level model may only have a central processing unit and does not include a graphics processing unit. For the models with only a central processing unit, only a vapor chamber that covers the central processing unit is needed and manufacturing cost can be saved by using a vapor chamber that only covers the central processing unit. For other models of the electronic device that include the graphics processing unit, the same vapor chamber segment that covers the central processing unit can be used and a vapor chamber segment that covers the graphics processing unit can be added. With the modular vapor chamber, one or more vapor chamber segments can be added to fit it to each model of the electronic device. The vapor chamber segments can be almost any shape depending on design choice and design constraints.

Current vapor chambers are made for a specific layout of an electronic device and cannot be used for different layouts. With a modular vapor chamber system, premade shapes of vapor chamber segments can be combined for several different layouts. In current electronic devices, when a board layout is changed, the vapor chamber often must be redesigned. The redesign of the vapor chamber can be relatively expensive as a new vapor chamber must be designed and manufactured. With the module vapor chamber, an entirely new vapor chamber does not need to be designed and manufactured because premade vapor chamber segments can be used to create the vapor chamber for the redesigned electronic device. The use of a modular vapor chamber can help to reduce the overall cost of a vapor chamber for an electronic device by eliminating the need to completely redesigned and manufacture a whole new vapor chamber for each electronic device across different models of the electronic device or different generations and allows reuse of portions of the modular vapor chamber across the different models and/or different generations of the electronic device. More specifically, rather than making a custom vapor chamber shape for a specific layout that cannot be reused for a different layout, it can be cost effective to pre-make vapor chamber segments and use one or more of the premade vapor chamber segments for each layout across different models and/or different generations of an electronic device.

In some examples, the modular vapor chamber includes two or more segments and at least two of the vapor chamber segments are thermally coupled together using vapor chamber coupling. The vapor chamber coupling can be solder, paste, a heat pipe, or some other means of thermally coupling together the two vapor chamber segments. More specifically, an extension can extend from each vapor chamber segment and the extensions can be coupled together. In some examples, the extension is a copper extension or some other thermally conductive extension. The extensions can be coupled together using solder, paste, thermal glue, or some other means of thermally coupling the extensions. By coupling two or more segments of the vapor chamber together, if one segment is drying out, the vapor chamber segment that is drying out can use the extensions to transfer heat to the other vapor chamber segment. A heat pipe could also be used to connect the vapor chambers together and the heat pipe could provide better thermal conductivity as compared to solder or thermal glue.

In some examples, one or more extensions can be added to a vapor chamber along the thinnest portion of the vapor chamber to help with thermal conductivity. For example, at the very edge of each vapor chamber segment where the walls of the vapor chamber are joined tether, there is no vapor and the edge of each vapor chamber segment is thinner (e.g., about 1 mm thinner) as compared to the sides of the vapor chamber that are located where there is vapor in the vapor chamber. More specifically, for some vapor chambers, the sides that are located where there is vapor inside the vapor chamber are typically about 1.6 mm in thickness and the edge located where there is no vapor (e.g., where the walls of the vapor chamber are joined together) are typically about 0.6 mm in thickness. The one or more extensions can be attached to the edges of the vapor chamber segments that are about 0.6 mm thick to help with thermal transfer of heat across the extensions. In other examples, the one or more extensions can be attached to the side of the vapor chamber where there is the working fluid inside the vapor chamber.

The premade vapor chamber segments can be modulated along the “x”, “y”, and “z” direction of an (x, y, z) coordinate axis or cartesian coordinate system. In some examples, the premade vapor chamber segments can also be used as a spacer or pedestal. A traditional pedestal typically does not have as higher thermal conductivity as a vapor chamber.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms “over,” “under,” “below,” “between,” and “on” as used herein refer to a relative position of one layer or component with respect to other layers or components. For example, one layer or component disposed on, over, or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component “directly on” a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase “A and/or B” means (A), (B), or (A and B). For the purposes of the present disclosure, the phrase “A, B, and/or C” means (A), (B), (C), (A and B), (A and C), (B and C), or (A, B, and C). Reference to “one embodiment” or “an embodiment” in the present disclosure means that a particular feature, structure, or characteristic described in connection with the embodiment is included in at least one embodiment. The appearances of the phrase “in one embodiment” or “in an embodiment” are not necessarily all referring to the same embodiment. The appearances of the phrase “for example,” “in an example,” or “in some examples” are not necessarily all referring to the same example.

Furthermore, the term “connected” may be used to describe a direct connection between the things that are connected, without any intermediary devices, while the term “coupled” may be used to describe either a direct connection between the things that are connected, or an indirect connection through one or more intermediary devices. The terms “substantially,” “close,” “approximately,” “near,” and “about,” generally refer to a plus or minus twenty percent (±20%) variation of a target value based on the context of a particular value as described herein or as known in the art. For example, about one (1) millimeter (mm) would include one (1) mm and ±0.2 mm from one (1) mm. Similarly, terms indicating orientation of various elements, e.g., “coplanar,” “perpendicular,” “orthogonal,” “parallel,” or any other angle between the elements, generally refer to being within plus or minus five to twenty percent (+/−5-20%) of a target value based on the context of a particular value as described herein or as known in the art.

Turning to FIG. 1A, FIG. 1A is a simplified diagram of an electronic device 102*a* configured with a modular vapor chamber 146*a*, in accordance with an embodiment of the present disclosure. In an example, the electronic device 102*a* can include one or more electronic components 104, one or more heat sources 106, a first vapor chamber segment 108, and a second vapor chamber segment 110. The first vapor chamber segment 108 and the second vapor chamber segment 110 can be coupled together using vapor chamber coupling 112. The vapor chamber coupling 112 is located in the gap or split line between the first vapor chamber segment 108 and the second vapor chamber segment 110 and helps to thermally couple the first vapor chamber segment 108 and the second vapor chamber segment 110. The first vapor chamber segment 108, the second vapor chamber segment 110, and the vapor chamber coupling 112 comprise the modular vapor chamber 146*a*. In some examples, the electronic device 102*a* can include one or more fans 114. For example, as illustrated in FIG. 1A, the electronic device 102*a* includes fans 114*a* and 114*b*.

Figure 1B:
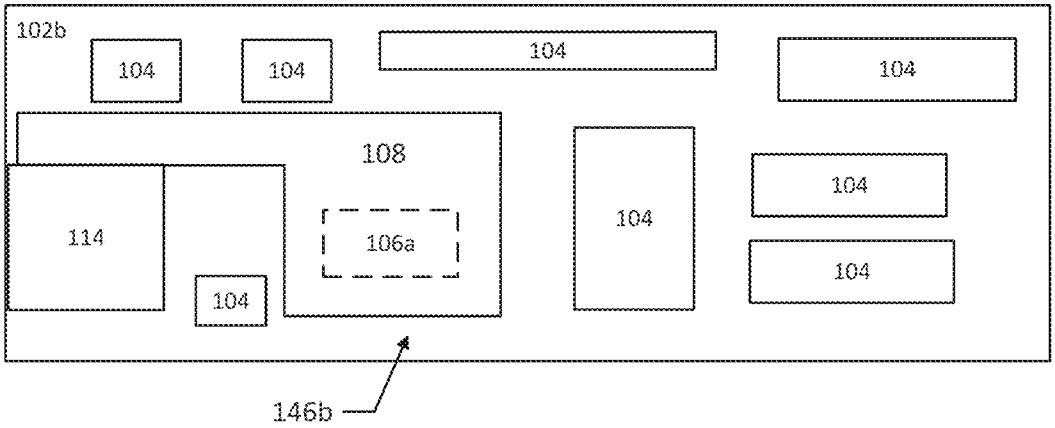

Turning to FIG. 1B, FIG. 1B is a simplified diagram of an electronic device 102*b* configured with a modular vapor chamber 146*b*, in accordance with an embodiment of the present disclosure. In an example, the electronic device 102*b* can include the one or more electronic components 104, the one or more heat sources 106, and the first vapor chamber segment 108. The first vapor chamber segment 108 comprises the modular vapor chamber 146*a*. In some examples, the electronic device 102*a* can include the one or more fans 114. For example, as illustrated in FIG. 1B, the electronic device 102*a* includes the fan 114*a*.

Figure 1C:
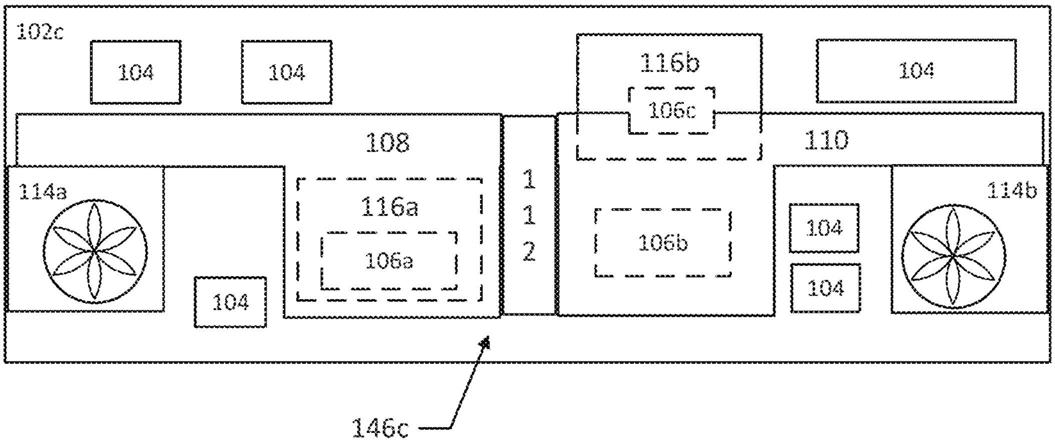

Turning to FIG. 1C, FIG. 1C is a simplified diagram of an electronic device 102*c* configured with a module vapor chamber 146*c*, in accordance with an embodiment of the present disclosure. In an example, the electronic device 102*c* can include the one or more electronic components 104, the one or more heat sources 106, the first vapor chamber segment 108, the second vapor chamber segment 110, and third vapor chamber segments 116*a* and 116*b*.

The first vapor chamber segment 108 and the second vapor chamber segment 110 can be coupled together using the vapor chamber coupling 112. The first vapor chamber segment 108, the second vapor chamber segment 110, the vapor chamber coupling 112, and the third vapor chamber segments 116*a* and 116*b* comprise the modular vapor chamber 146*a*. In some examples, the electronic device 102*a* can include the one or more fans 114. For example, as illustrated in FIG. 1C, the electronic device 102*a* includes the fan 114*a* and the fan 114*b*.

With the module vapor chamber, an entirely new vapor chamber does not need to be designed and manufactured for each of the electronic devices 102*a*-102*c* because premade vapor chamber segments (e.g., first vapor chamber segment 108 and/or the second vapor chamber segment 110) can be used to create the vapor chamber for each of the electronic devices 102*a*-102*c*. The use of a modular vapor chamber can help to reduce the overall cost of the vapor chamber for each of the electronic devices 102*a*-102*c* by reducing the portion of the vapor chamber that must be redesigned across different models or different generations and allows reuse of portions of the modular vapor chamber across different models and/or different generations of electronic devices. More specifically, rather than making a custom vapor chamber shape for each of the electronic devices 102*a*-102*c* that cannot be reused or covers an area that does not need to be covered by a vapor chamber (e.g., if an electronic device includes a computer processing unit but does not include a graphics processing unit, then the electronic device does not need a vapor chamber that was designed for an electronic device with a processor and a graphics processing unit), one or more of the premade vapor chamber segments (e.g., first vapor chamber segment 108, the second vapor chamber segment 110, and/or the third vapor chamber segment 116) can be used to create the vapor chamber for each of the electronic devices 102*a*-102 *c*.

Each of the electronic components 104 can be a device or group of devices available to assist in the operation or function of the electronic device 102*a*. Each of one or more heat sources 106 may be a heat generating device (e.g., processor, logic unit, field programmable gate array (FPGA), chip set, a graphics processor, graphics card, battery, memory, or some other type of heat generating device). Each of the fans 114*a* and 114*b* can be an air-cooling system to move air and dissipate heat collected by the first vapor chamber segment 108, the second vapor chamber segment 110, and/or the third vapor chamber segments 116*a* and 116*b* from the one or more heat sources 106.

The first vapor chamber segment 108 can be a heat spreader, vapor chamber, cold pipe, heat transfer pedestal, or some other thermal element or component that can help to transfer heat away from one or more of the heat sources 106. The second vapor chamber segment 110 can be a heat spreader, vapor chamber, cold pipe, heat transfer pedestal, or some other thermal element or component that can help to transfer heat away from one or more of the heat sources 106. The third vapor chamber segments 116*a* and 116*b* can each be a heat spreader, vapor chamber, cold pipe, heat transfer pedestal, or some other thermal element or component that can help to transfer heat away from one or more of the heat sources 106.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source. One way to cool a heat source is to use a heat pipe or vapor chamber.

Heat pipes and vapor chambers are heat-transfer devices that combine the principles of both thermal conductivity and phase transition to transfer heat between two interfaces (e.g., a heat source and a cold or cool interface such as a heatsink). At the hot interface of a heat pipe or vapor chamber (e.g., the portion of the heat pipe or vapor chamber near the heat source), a liquid in contact with a thermally conductive solid surface near the heat source turns into a vapor by absorbing heat from the heat source. The vapor then travels along the heat pipe or through the vapor chamber to the cold or cool interface and condenses back into a liquid, releasing the collected heat. The liquid then returns to the hot interface through either capillary action, centrifugal force, or gravity and the cycle repeats.

A typical heat pipe or vapor chamber consists of a sealed pipe or tube made of a material that is compatible with a working fluid (e.g., copper for water heat pipes or aluminum for ammonia heat pipes). During construction of the heat pipe or vapor chamber, a vacuum pump is typically used to remove the air from an empty heat pipe or vapor chamber. The heat pipe or vapor chamber is partially filled with the working fluid and then sealed. The working fluid mass is chosen such that the heat pipe or vapor chamber contains both vapor and liquid over a desired operating temperature range. Below the operating temperature, the liquid is cold and cannot vaporize into a gas. Above the operating temperature, all the liquid has turned to gas, and the environmental temperature is too high for any of the gas to condense.

Working fluids are chosen according to the temperatures at which the heat pipe or vapor chamber will operate. For example, at extremely low temperature applications, (e.g., about 2-4 K) liquid helium may be used as the working fluid and for extremely high temperatures, mercury (e.g., about 523-923 K), sodium (e.g., about 873-1473 K), or indium (e.g., about 2000-3000 K) may be used as the working fluid. The vast majority of heat pipes or vapor chambers for room temperature applications use water (e.g., about 298-573 K), ammonia (e.g., about 213-373 K), or alcohol (e.g., methanol (e.g., about 283-403 K) or ethanol (e.g., about 273-403 K)) as the fluid. Copper/water heat pipes or vapor chambers have a copper envelope, use water as the working fluid and typically operate in the temperature range of about twenty degrees Celsius (20° C.) to about one-hundred and fifty degrees Celsius (150° C.). Water heat pipes or vapor chambers are sometimes filled by partially filling the heat pipe or vapor chamber with water, heating until the water boils and displaces the air inside the heat pipe or vapor chamber, and then sealing the heat pipe or vapor chamber while hot.

Vapor chambers are often regarded as the best thermal solution for systems, especially thin laptop systems. However, the cost of a vapor chamber specifically designed for a specific system can be a major issue and prevents the use of a vapor chamber in more laptop systems. Typically, a new vapor chamber is created for every change in the layout of an electronic device, even if there is no change in the board layout which can happen across different models of the laptop or different generations of the same laptop series. However, tooling cost for a new vapor chamber design can be a relatively costly proposition.

In a specific illustrative example, an electronic device can include a main processor (e.g., a computer processing unit) with a first height and a graphics processor with a second height that is different from the first height. Considering the height differences, the pedestal on the main processor may be relatively thick which leads to a reduced air gap to keep the overall system thin. Consider that a variant of the electronic device is to be created with a different main processor having a different die location or die height. To create a vapor chamber for the variant electronic device would involve changing the entire vapor chamber design and require new tooling which can become a relatively costly proposition. What is needed is a means, system, apparatus, method, etc. of allowing for a modular vapor chamber and a means, system, apparatus, method, etc. of connecting the modular segments of the vapor chamber together.

A system to enable a modular vapor chamber and the connection of segments of the modular vapor chamber, as outlined in FIG. 1, can resolve these issues (and others). In an example, a modular vapor chamber can be used in an electronic device and across generations/variants of the electronic device. In some examples, two or more segments of the modular vapor chamber can be thermally coupled together. The modular vapor chamber can be used to help reduce the cost of electronic devices by allowing different segments of the modular vapor chamber to be used for subsequent or multiple models of electronic devices across generations/variants. By allowing the different segments of the modular vapor chamber to be used for subsequent or multiple models of electronic devices across generations/variants, the system can help improved manufacturing yield rate and cost saving on tooling and help reduce the overall cost of manufacturing the electronic device and multiple models of electronic devices across generations/variants. In an example, the modular vapor chamber can have two separate vapor chamber segments, one vapor chamber segment for a central processing unit and a second vapor chamber segment for a graphics processing unit such that any change in the graphics processing unit section can be easily accommodated at a reduced cost (as compared to a complete redesign and manufacture of the entire vapor chamber) by changing the vapor chamber segment for the graphics processing unit portion while keeping the vapor chamber segment for the central processing unit same.

However, using two modular vapor chamber segments causes a gap or split line between one vapor chamber segment and the other vapor chamber segment. Due to the split, there cannot be any heat transfer from the vapor chamber on the central processing unit to the vapor chamber on the graphics processing unit side and vice versa. This would impact the power share between the central processing unit and the graphics processing unit and more importantly, each hotspot thermal load is borne separately by the vapor chamber associated with each hotspot and by the fins and fan on each side (if present), requiring for an overdesigned system.

In an illustrative example, the modular vapor chamber segments can be thermally coupled together using an extension that can extend along the gap or split line between one vapor chamber segment and the other vapor chamber segment. In an example, the extension is a bent metal extension and more specifically, a bent copper extension. The extensions can be coupled together by directly soldering the extensions together or placing a miniature heat pipe between the extension of one vapor chamber and the extension of the other vapor chamber.

In another illustrative example, the modular vapor chamber segments can be thermally coupled together using a spring clip that can coupled the extensions together. The spring clip can extend along the gap or split line between one vapor chamber segment and the other vapor chamber segment. In an example, a thermal interface material (TIM)/gap pad is placed between the two copper extensions which are then pressure loaded using the spring clip. In a specific example, to secure the clips on the extensions, a dimple feature can be used to provide a friction force.

In an example, the top plate of a first vapor chamber segment, the bottom plate of the first vapor chamber segment or both the top plate and the bottom plates of the first vapor chamber segment are extended from the main body of the first vapor chamber segment. In addition, the top plate of a second vapor chamber segment, the bottom plate of the second vapor chamber segment or both the top plate and the bottom plates of the second vapor chamber segment are extended from the main body of the second vapor chamber segment. In some examples, the extension from the first vapor chamber segment and/or the extension from the second vapor chamber segment are bent depending on the height difference between the first vapor chamber segment and the second vaper chamber segment. The extension from the first vapor chamber segment and the extension from the second vapor chamber segment can be thermally coupled together to couple the first vapor chamber segment to the second vapor chamber segment. In some examples, the extension from the first vapor chamber segment and/or the extension from the second vapor chamber segment are copper extensions that are soldered together. In other examples, the extension from the first vapor chamber segment and/or the extension from the second vapor chamber segment are joined with a heat pipe in between the segments. The heat pipe can be relatively thin (e.g., an about 2 mm in diameter heat pipe flattened to about 0.4 mm). The length and shape of the extension from the first vapor chamber segment and the extension from the second vapor chamber segment depends on design choice and design constraints.

In an example, TIM can be applied on both the extensions and the extensions can be coupled together. In a specific example, the extensions are hand pressed together for positioning. After the extensions are held together, spring clips can be inserted from either side of the outside edges. The spring then squeezes the excess TIM paste between the extensions and the excess TIM paste can be removed. The loading on the TIM from the spring ensures good thermal contact between the extensions from each vapor chamber segment.

The modular vapor chamber can help to further increase the cooling capability of the electronic device, especially thin high-powered laptops when increased cooling is needed without increasing system Z-height when increased cooling is not needed. The term "Z-height," "Z location," etc. refers to the height along the "Z" axis of an (x, y, z) coordinate axis or cartesian coordinate system. More specifically, the modular vapor chamber allows higher air gaps above the central processing vapor chamber segment which allows for higher flows in hybrid hyperbaric architectures and positively impacts the skin temperatures which can be leveraged either in terms of performance or acoustics benefit.

Figure 2A:
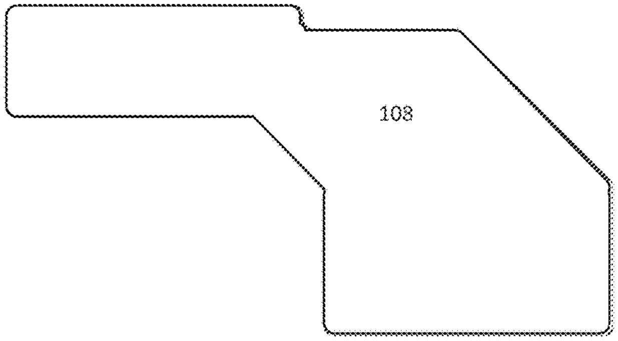
FIGS. 2A-2E are a simplified diagrams illustrating examples details of a system to enable a modular vapor chamber and the connection of segments of the modular vapor chamber, in accordance with an embodiment of the present disclosure.

Turning to FIG. 2A-2E, FIGS. 2A-2E are simple block diagrams illustrating example details of a portion of a modular vapor chamber, in accordance with an embodiment of the present disclosure. Turning to FIG. 2A, FIG. 2A is a simplified diagram of the first vapor chamber segment 108. As illustrated in FIG. 2A, the first vapor chamber segment 108 can have a profile that allows the first vapor chamber segment 108 to collect heat from a heat source and transfer the collected heat away from the heat source. For example, as illustrated in FIG. 1B, the first vapor chamber segment 108 can have a profile that allows the first vapor chamber segment 108 to collect heat from the first heat source 106*a* and transfer the collected heat to the fan 114 and away from the first heat source 106*a*.

Figure 2B:
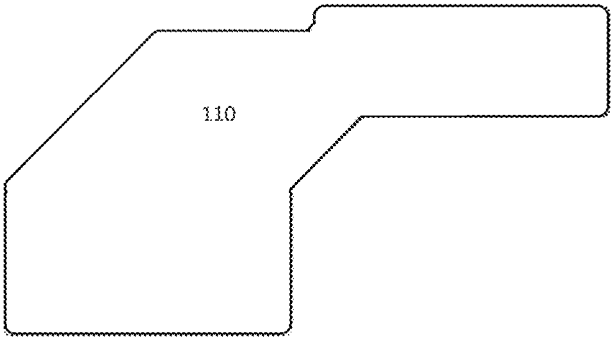

Turning to FIG. 2B, FIG. 2B is a simplified diagram of the second vapor chamber segment 110. As illustrated in FIG. 2B, the second vapor chamber segment 110 can have a profile that allows the second vapor chamber segment 110 to collect heat from a heat source and transfer the collected heat away from the heat source. For example, as illustrated in FIG. 1A, the second vapor chamber segment 110 can have a profile that allows the second vapor chamber segment 110 to collect heat from the second heat source 106*b* and transfer the collected heat to the fan 114 and away from the second heat source 106*b*. In some examples, the second vapor chamber segment 110 can be a mirror image of the first vapor chamber segment 108. In other examples, the second vapor chamber segment 110 is a rotated or flipped first vapor chamber segment 108 and is the same as the first vapor chamber segment 108.

Figure 2C:
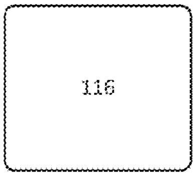

Turning to FIG. 2C, FIG. 2C is a simplified diagram of the third vapor chamber segment 116. As illustrated in FIG. 2C, the third vapor chamber segment 116 can have a profile that allows the third vapor chamber segment 116 to collect heat from a heat source and transfer the collected heat away from the heat source. For example, as illustrated in FIG. 1C, the third vapor chamber segment 116*a* can have a profile that allows the third vapor chamber segment 116*a* to collect heat from the first heat source 106*a* and transfer the collected heat to the first vapor chamber segment 108 and away from the first heat source 106*a*. In addition, the third vapor chamber segment 116*b* can have a profile that allows the third vapor chamber segment 116*b* to collect heat from the heat source 106*c* and transfer the collected heat to the second vapor chamber segment 110. In some examples, the third vapor chamber segment 116 can also function as a gap pad, pedestal, or riser. For example, the electronic device 102*c* can include a main processor (e.g., the first heat source 106*a*) with a first height and a graphics processor (e.g., the second heat source 106*b*) with a second height that is different from the first height. The third vapor chamber segment 116*a* can be used as a gap pad, pedestal, or riser to accommodate the height difference between the main processor and the graphics processor.

Figure 2D:
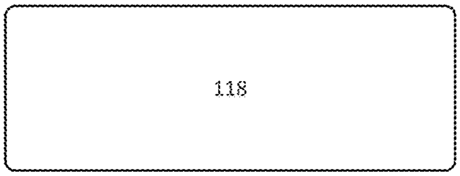
Figure 4:
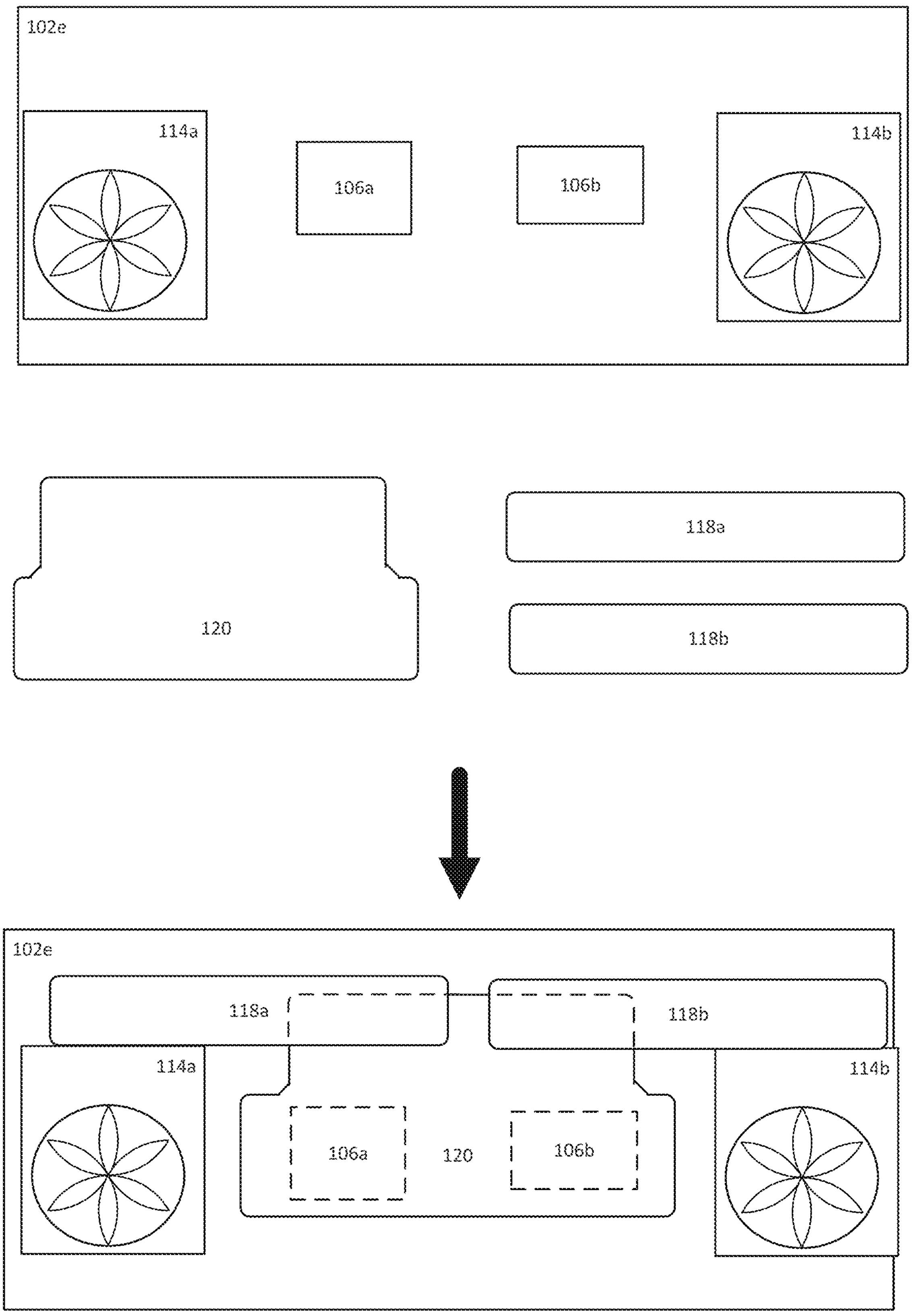
FIG. 4 is a simplified diagram illustrating examples details of a system to enable a modular vapor chamber, in accordance with an embodiment of the present disclosure.

Turning to FIG. 2D, FIG. 2D is a simplified diagram of a fourth vapor chamber segment 118. As illustrated in FIG. 2D, the fourth vapor chamber segment 118 can have a profile that allows the fourth vapor chamber segment 118 to help transfer collected heat away from a heat source. For example, the fourth vapor chamber segment 118 can have a profile that allows the fourth vapor chamber segment 118 to collect heat from a heat source and transfer the collected heat to another vapor chamber or a fan. In another example, the fourth vapor chamber segment 118 can have a profile that allows the fourth vapor chamber segment 118 to collect heat from another vapor chamber (e.g., the fifth vapor chamber segment 120 as illustrated in FIG. 4) and transfer the collected heat to a fan (e.g., a fan 114*a* as illustrated in FIG. 4). In some examples, the fourth vapor chamber segment 118 can also function as a gap pad, pedestal, or riser.

Figure 2E:
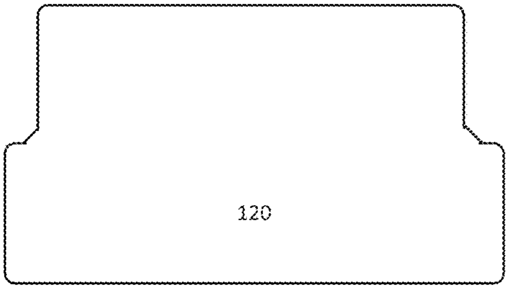
Figure 6:
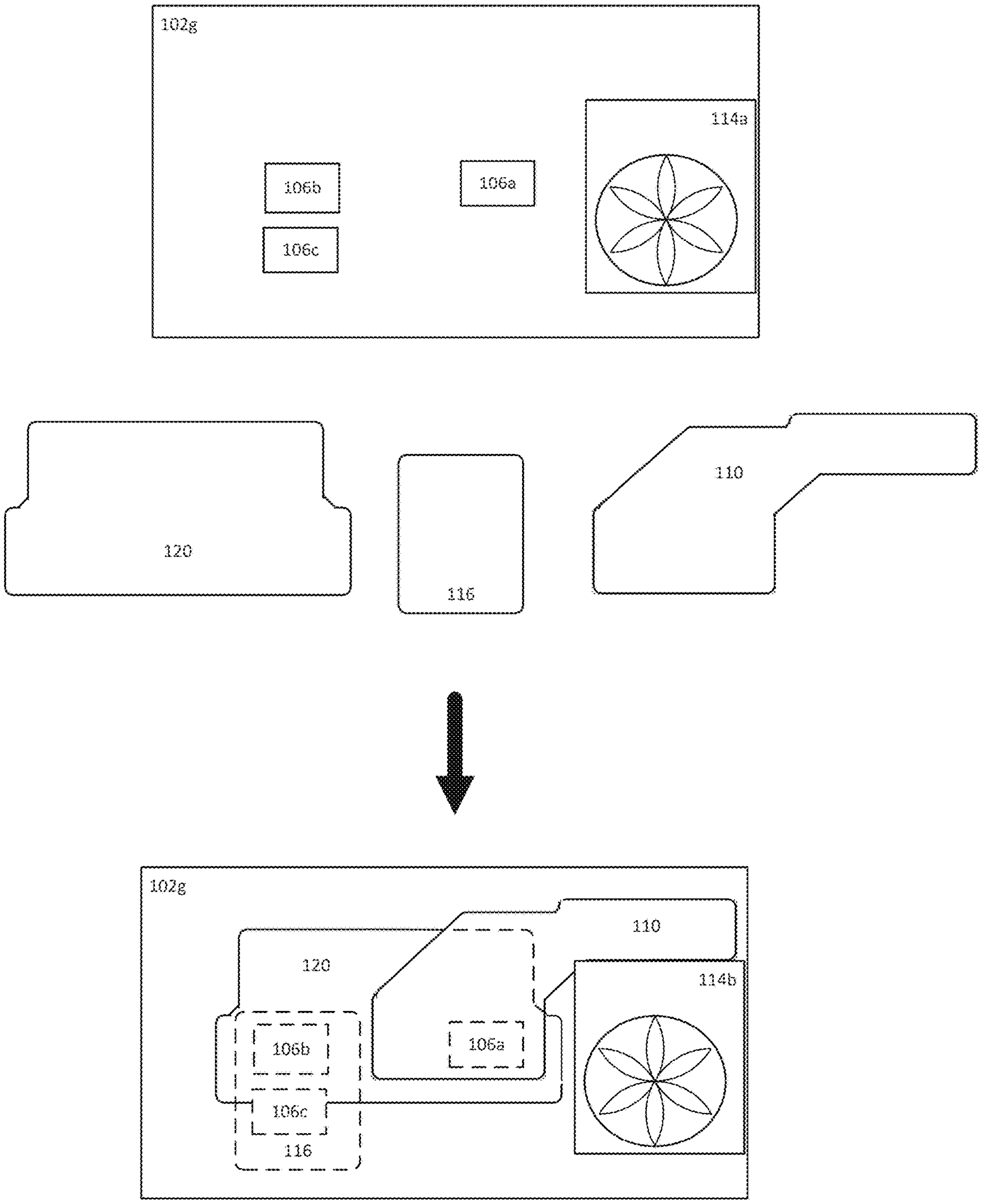
FIG. 6 is a simplified diagram illustrating examples details of a system to enable a modular vapor chamber, in accordance with an embodiment of the present disclosure.

Turning to FIG. 2E, FIG. 2E is a simplified diagram of a fifth vapor chamber segment 120. As illustrated in FIG. 2E, the fifth vapor chamber segment 120 can have a profile that allows the fifth vapor chamber segment 120 to help transfer collected heat away from a heat source. For example, the fifth vapor chamber segment 120 can have a profile that allows the fifth vapor chamber segment 120 to collect heat from a heat source (e.g., the heat source 106 as illustrated in FIG. 6) and transfer the collected heat to another vapor chamber (e.g., the vapor chamber 110 as illustrated in FIG. 6) or a fan. In another example, the fifth vapor chamber segment 120 can have a profile that allows the fifth vapor chamber segment 120 to collect heat from another vapor chamber and transfer the collected heat to a fan. In some examples, the fifth vapor chamber segment 120 can also function as a gap pad, pedestal, or riser.

Figure 3A:
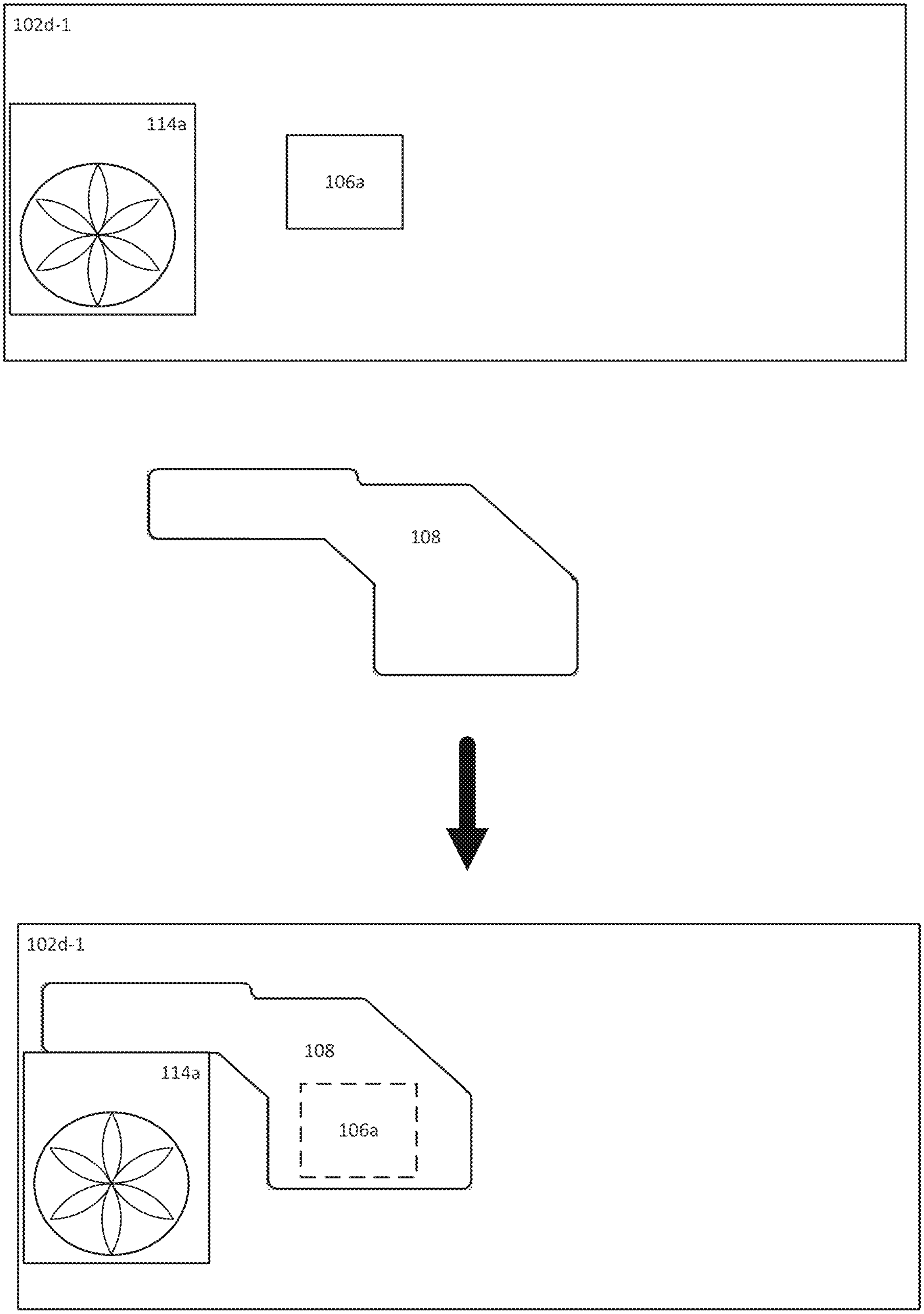
FIG. 3A is a simplified diagram illustrating examples details of a system to enable a modular vapor chamber, in accordance with an embodiment of the present disclosure.

Turning to FIG. 3A, FIG. 3A is a simplified diagram of an electronic device 102*d*-1 configured with a modular vapor chamber, in accordance with an embodiment of the present disclosure. In an example, the electronic device 102*d*-1 can be a lower tier configuration of an electronic device. More specifically, the electronic device 102*d*-1 can include the one or more electronic components (e.g., the electronic components 104), the first heat source 106*a*, and the fan 114*a*. In an example, the first heat source 106*a* is a central processing unit or main processor. As illustrated in FIG. 3A, the first vapor chamber segment 108 can be used as the vapor chamber for the electronic device 102*d*-1 to help move the heat from the first heat source 106*a* to the fan 114*a*.

Figure 3B:
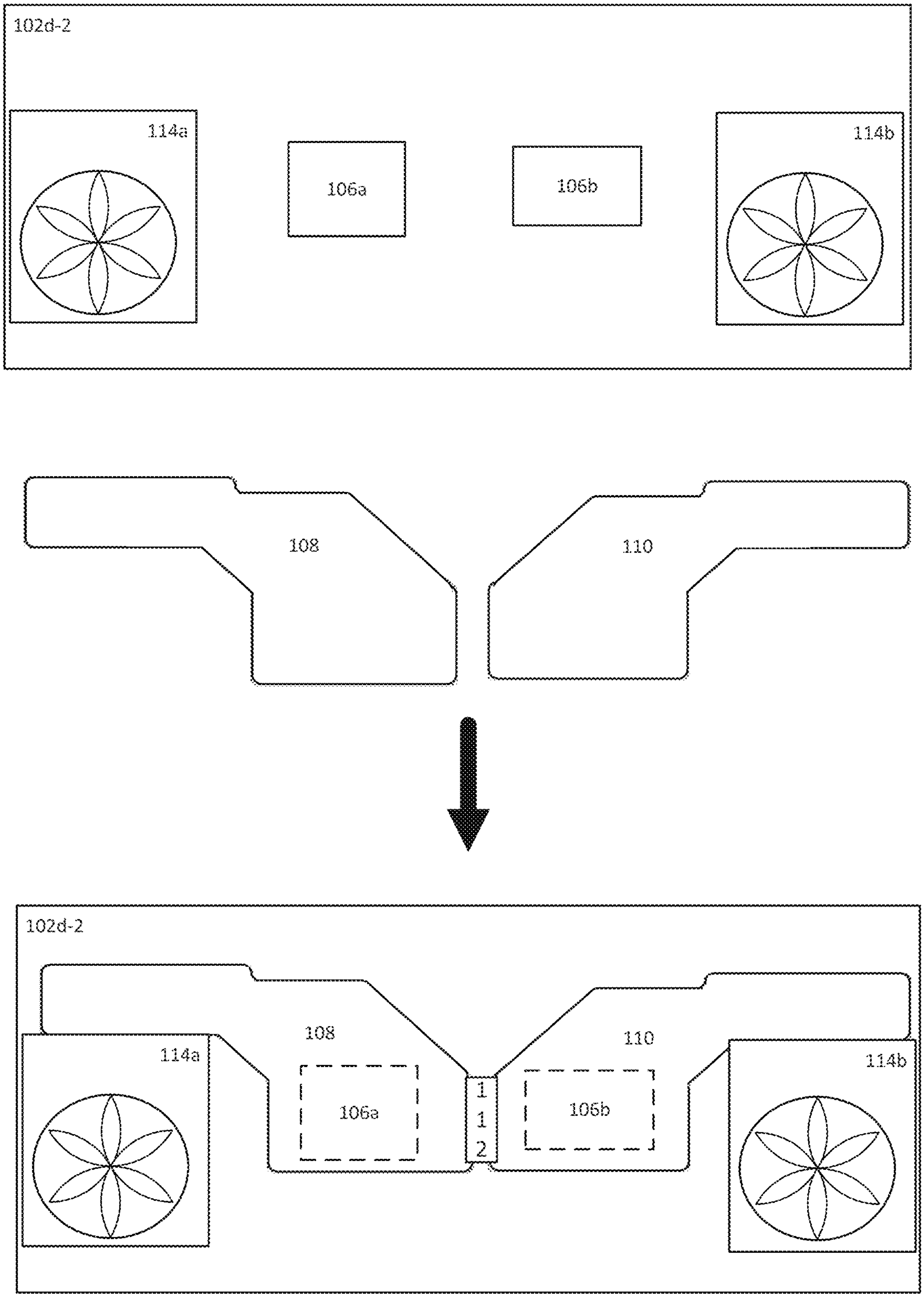
FIG. 3B is a simplified diagram illustrating examples details of a system to enable a modular vapor chamber and the connection of segments of the modular vapor chamber, in accordance with an embodiment of the present disclosure.

Turning to FIG. 3B, FIG. 3B is a simplified diagram of an electronic device 102*d*-2 configured with a modular vapor chamber and the connection of segments of the modular vapor chamber, in accordance with an embodiment of the present disclosure. In an example, the electronic device 102*d*-2 can be a mid-tier configuration of an electronic device. More specifically, the electronic device 102*d*-2 can include the one or more electronic components (e.g., the electronic components 104), the first heat source 106*a*, the second heat source 106*b*, the fan 114*a*, and the fan 114*b*. In an example, the first heat source 106*a* is a central processing unit or main processor and the second heat source 106*b* is a graphics processing unit. As illustrated in FIG. 3B, the first vapor chamber segment 108 can be used as the vapor chamber for the electronic device 102*d*-2 to help move the heat from the first heat source 106*a* to the fan 114*a* and the second vapor chamber segment 110 can be used as the vapor chamber for the electronic device 102*d*-2 to help move the heat from the second heat source 106*b* to the fan 114*b*. The first vapor chamber segment 108 can be thermally coupled to the second vapor chamber segment 110 using the vapor chamber coupling 112.

Note that the electronic device 102*d*-2 is different than the electronic device 102*d*-1, however, the electronic device 102*d*-2 can share the same vapor chamber segment (e.g., the first vapor chamber segment 108) as the electronic device 102*d*-1. To accommodate the differences between the electronic device 102*d*-2 and electronic device 102*d*-1, the second vapor chamber segment 110 can be added to the electronic device 102*d*-2 and a whole new vapor chamber does not need to be designed and manufactured for the electronic device 102*d*-2. This helps to prevent a need to design and manufacture a whole new vapor chamber across different models of the electronic device or different generations and allows reuse of portions of the modular vapor chamber across different models and/or different generations of electronic devices.

Figure 3C:
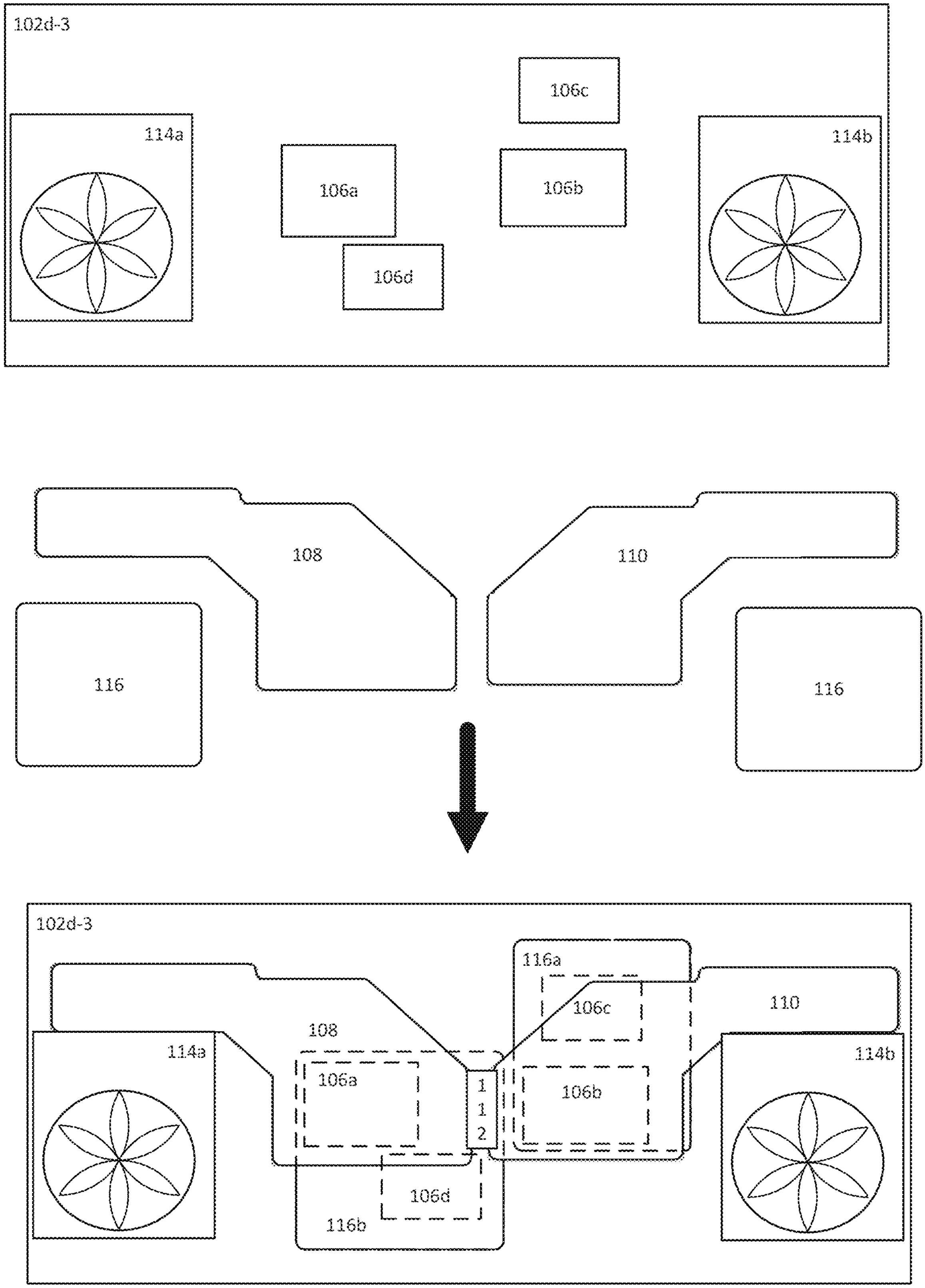
FIG. 3C is a simplified diagram illustrating examples details of a system to enable a modular vapor chamber and the connection of segments of the modular vapor chamber, in accordance with an embodiment of the present disclosure.

Turning to FIG. 3C, FIG. 3C is a simplified diagram of an electronic device 102*d*-3 configured with a modular vapor chamber and the connection of segments of the modular vapor chamber, in accordance with an embodiment of the present disclosure. In an example, the electronic device 102*d*-3 can be a high tier configuration of an electronic device. More specifically, the electronic device 102*d*-3 can include the one or more electronic components (e.g., the electronic components 104), the first heat source 106*a*, the second heat source 106*b*, the heat source 106*c*, a heat source 106*d*, the fan 114*a*, and the fan 114*b*. In an example, the first heat source 106*a* is a central processing unit or main processor, the second heat source 106*b* is a graphics processing unit, the heat source 106*c* can be a virtual reality processing unit, and the heat source 106*d* can be coprocessor used to supplement the central processing unit or main processor. As illustrated in FIG. 3C, the first vapor chamber segment 108 can be used to help move the heat from the first heat source 106*a* and the heat source 106*d* to the fan 114*a* and the second vapor chamber segment 110 can be used to help move the heat from the second heat source 106*b* and the heat source 106*c* to the fan 114*b*. Also, the third vapor chamber segment 116*b* can be used to help move the heat from the first heat source 106*a* and the heat source 106*d* to the first vapor chamber segment 108 and on to the fan 114*a* and the third vapor chamber segment 116*a* can be used to help move the heat from the second heat source 106*b* and the heat source 106*c* to the second vapor chamber segment 110 and on to the fan 114*b*. The first vapor chamber segment 108 can be thermally coupled to the second vapor chamber segment 110 using the vapor chamber coupling 112.

Note that the electronic device 102*d*-3 is different than the electronic devices 102*d*-1 and 102*d*-2, however, the electronic device 102*d*-2 can share the same vapor chamber segment (e.g., the first vapor chamber segment 108) as the electronic device 102*d*-1 and the same vapor chamber segments (e.g., the first vapor chamber segment 108 and the second vapor chamber segment 110) as the electronic device 102*d*-2. To accommodate the differences between the electronic device 102*d*-2 and electronic device 102*d*-1, the third vapor chamber segment 116*a* and the third vapor chamber segment 116*a* can be added to the electronic device 102*d*-3 and a whole new vapor chamber does not need to be designed and manufactured for the electronic device 102*d*-3. This helps to prevent a need to design and manufacture a whole new vapor chamber across different models of the electronic device or different generations and allows reuse of portions of the modular vapor chamber across different models and/or different generations of electronic devices.

Turning to FIG. 4, FIG. 4 is a simplified diagram of an electronic device 102*e* configured with a modular vapor chamber, in accordance with an embodiment of the present disclosure. In an example, the electronic device 102*e* can be the same as or similar to the electronic device 102*d*-2. More specifically, the electronic device 102*e* can include the one or more electronic components (e.g., the electronic components 104), the first heat source 106*a*, the second heat source 106*b*, the fan 114*a*, and the fan 114*b*. In an example, the first heat source 106*a* is a central processing unit or main processor and the second heat source 106*b* is a graphics processing unit. As illustrated in FIG. 4, the fifth vapor chamber segment 120 and a fourth vapor chamber segment 118*a* can be used to help move the heat from the first heat source 106*a* to the fan 114*a* and the fifth vapor chamber segment 120 and a fourth vapor chamber segment 118*b* can be used to help move the heat from the second heat source 106*b* to the fan 114*b*.

Note that while the electronic device 102*e* and the electronic device 102*d*-2 share the same or a similar configuration, different modular vapor chamber segments can be used to help move the heat from the one or more heat sources to the one or more fans. More specifically, the first heat source 106*a*, the second heat source 106*b*, the fan 114*a*, and the fan 114*b* are in the same or about that same location in both the electronic device 102*e* and the electronic device 102*d*-2.

However, as illustrated in FIG. 4, the fifth vapor chamber segment 120 and the fourth vapor chamber segment 118*a* can be used as the vapor chamber for the electronic device 102*e* to help move the heat from the first heat source 106*a* to the fan 114*a* and the fifth vapor chamber segment 120 and a fourth vapor chamber segment 118*b* can be used as the vapor chamber for the electronic device 102*d*-2 to help move the heat from the second heat source 106*b* to the fan 114*b*. In an alternate configuration, as illustrated in FIG. 3B, the first vapor chamber segment 108 can be used as the vapor chamber for the electronic device 102*d*-2 to help move the heat from the first heat source 106*a* to the fan 114*a* and the second vapor chamber segment 110 can be used as the vapor chamber for the electronic device 102*d*-2 to help move the heat from the second heat source 106*b* to the fan 114*b*. This helps to prevent a need to design and manufacture a whole new vapor chamber across different models of the electronic device or different generations and allows use the same modular vapor chamber segments across different models and/or different generations of electronic devices.

Figure 5:
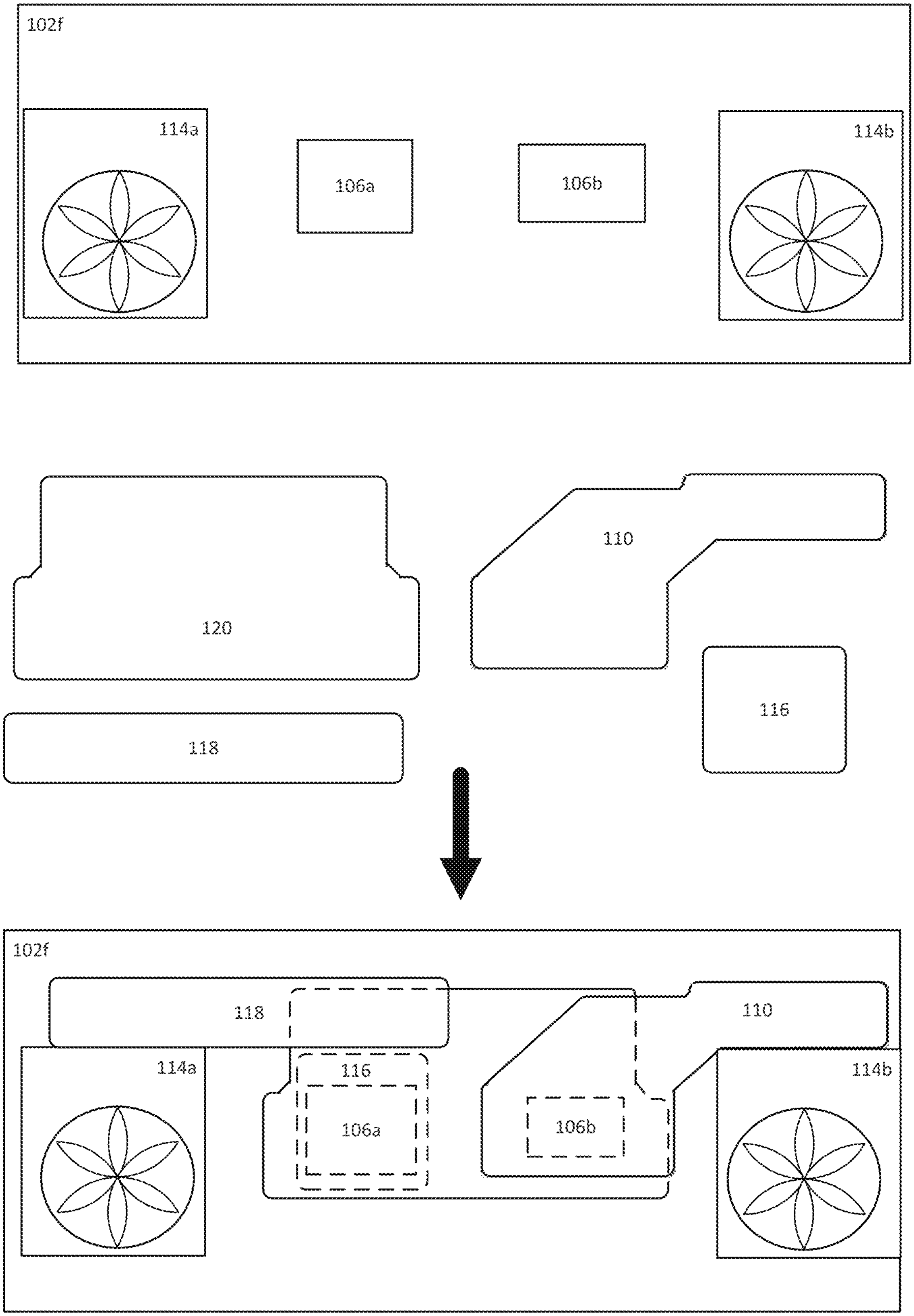
FIG. 5 is a simplified diagram illustrating examples details of a system to enable a modular vapor chamber, in accordance with an embodiment of the present disclosure.

Turning to FIG. 5, FIG. 5 is a simplified diagram of an electronic device 102*f* configured with a modular vapor chamber and the connection of segments of the modular vapor chamber, in accordance with an embodiment of the present disclosure. In an example, the electronic device 102*f* can be the same as or similar to the electronic device 102*d*-2 and the electronic device 102*e*. More specifically, the electronic device 102*e* can include the one or more electronic components (e.g., the electronic components 104), the first heat source 106*a*, the second heat source 106*b*, the fan 114*a*, and the fan 114*b*. In an example, the first heat source 106*a* is a central processing unit or main processor and the second heat source 106*b* is a graphics processing unit. As illustrated in FIG. 5, the third vapor chamber segment 116, the fourth vapor chamber segment 118, and the fifth vapor chamber segment 120 can be used as the vapor chamber for the electronic device 102*f* to help move the heat from the first heat source 106*a* to the fan 114*a* and the fifth vapor chamber segment 120 and a second vapor chamber segment 110 can be used to help move the heat from the second heat source 106*b* to the fan 114*b*. In some examples, the first heat source 106*a* has a first height and the second heat source 106*b* has a second height that is different than the first height (e.g., the second heat source 106*b* has a greater height than the first heat source 106*a*). The third vapor chamber segment 116 can be used as a gap pad, pedestal, or riser to accommodate the difference between the first heat source 106*a* and the second heat source 106*b*.

Note that while the electronic device 102*f*, the electronic device 102*e* and the electronic device 102*d*-2 share the same or a similar configuration, different modular vapor chamber segments can be used to help move the heat from the one or more heat sources to the one or more fans. In addition, if necessary, the third vapor chamber segment 116 can be used as a gap pad, pedestal, or riser to accommodate the difference between the first heat source 106*a* and the second heat source 106*b*. This helps to prevent a need to design and manufacture a whole new vapor chamber across different models of the electronic device or different generations and allows use of the same modular vapor chamber segments across different models and/or different generations of electronic devices.

Turning to FIG. 6, FIG. 6 is a simplified diagram of an electronic device 102*g* configured with a modular vapor chamber and the connection of segments of the modular vapor chamber, in accordance with an embodiment of the present disclosure. In an example, the electronic device 102*g* can include the one or more electronic components (e.g., electronic components 104), the first heat source 106*a*, the second heat source 106*b*, the heat source 106*c*, and the fan 114*a*. In an example, the first heat source 106*a* is a central processing unit or main processor, the second heat source 106*b* is a graphics processing unit, and the heat source 106*c* is a virtual reality graphics processing unit. As illustrated in FIG. 6, the second vapor chamber segment 110 and the fifth vapor chamber segment 120 can be used to help move the heat from the first heat source 106*a* to the fan 114*a* and the third vapor chamber segment 116 and the fifth vapor chamber segment 120 can be used to help move the heat from the second heat source 106*b* and the heat source 106*c* to the fan 114*a*.

Note that the electronic device 102*g* is different than each of the electronic devices 102*a*-102*f*1, however, the electronic device 102*g* can share one or more of the same module vapor chambers without having to design and manufacture a whole new vapor chamber for the electronic device 102*g*. More specifically, the electronic device 102*g* can use the second vapor chamber segment 110 used in the electronic devices 102*a* and 102*c*, the third vapor chamber segment 116 used in electronic devices 102*d*-3 and 102*f*, and the fifth vapor chamber segment 120 used in electronic devices 102*e* and 102*f*. This helps to prevent a need to design and manufacture a whole new vapor chamber across different models of the electronic device or different generations and allows reuse of portions of the modular vapor chamber across different models and/or different generations of electronic devices.

Figure 7:
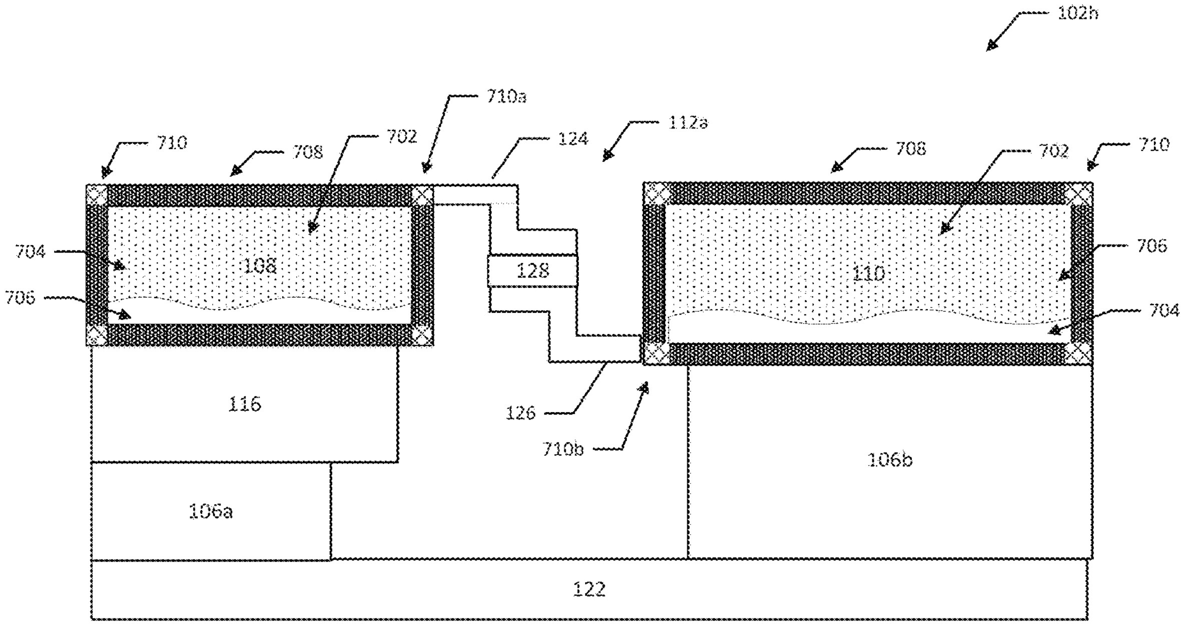
FIG. 7 is a simplified diagram illustrating examples details of a system to enable a modular vapor chamber and the connection of segments of the modular vapor chamber, in accordance with an embodiment of the present disclosure.

Turning to FIG. 7, FIG. 7 is a simplified diagram of an electronic device 102*h* configured with a modular vapor chamber and the connection of segments of the modular vapor chamber, in accordance with an embodiment of the present disclosure. In an example, the electronic device 102*h* can be the same as or similar to the electronic device 102*d*-3. More specifically, the electronic device 102*h* can include the first heat source 106*a* and the second heat source 106*b*. The first heat source 106*a* and the second heat source 106*b* can be on a support structure 122. The support structure 122 can be a printed circuit board.

The first vapor chamber segment 108 and the third vapor chamber segment 116 can be used to help move heat away from the first heat source 106*a* (e.g., to the fan 114*a*, not shown) and the second vapor chamber segment 110 can be used to help move heat away from the second heat source 106*b* (e.g., to the fan 114*b*, not shown). As illustrated in FIG. 7, the first heat source 106*a* has a first height and the second heat source 106*b* has a second height that is different than the first height (e.g., the second heat source 106*b* has a greater height than the first heat source 106*a*). The third vapor chamber segment 116 can be used as a gap pad, pedestal, or riser to accommodate the difference between the first heat source 106*a* and the second heat source 106*b*. The third vapor chamber segment 116 can be thermally coupled to the first vapor chamber segment 108 using solder, paste, or some other means of thermally coupling together the first vapor chamber extension 124 and the third vapor chamber segment 116.

The first vapor chamber segment 108 can include a working fluid 702 (e.g., water) in the interior portion of the vapor chamber. At a hot interface of the first vapor chamber segment 108 (e.g., the area where an outer wall of the first vapor chamber segment 108 is proximate to a heat source or the third vapor chamber segment 116 that has collected heat from the first heat source 106*a*) the working fluid 702 turns into a vapor 704 by absorbing heat from the hot interface.

The vapor 704 then travels to a cooler interface, condenses into a liquid 706, and releases heat to the cooler interface. The liquid 706 then returns to the hot interface through capillary action, centrifugal force, gravity, etc. and the cycle repeats. The first vapor chamber segment 108 can include vapor wall portions 708 and non-vapor wall portions 710. The vapor wall portions 708 are the sides or edges of the vapor chamber that are located where there is working fluid 702 (the vapor 704 or the liquid 706) in the vapor chamber. The non-vapor wall portions 710 are the sides or edges of the vapor chamber that are located where the walls of the vapor chamber are joined together (e.g., there is no vapor next to the non-vapor wall portion 710 or vapor only at a corner or the non-vapor wall portion 710).

Also, the second vapor chamber segment 110 can include the working fluid 702 (e.g., water) in the interior portion of the vapor chamber. At a hot interface of the second vapor chamber segment 110 (e.g., the area where an outer wall of the second vapor chamber segment 110 is proximate to the second heat source 106*b*) the working fluid 702 turns into the vapor 704 by absorbing heat from the hot interface. The vapor 704 then travels to a cooler interface, condenses into the liquid 706, and releases heat to the cooler interface. The liquid 706 then returns to the hot interface through capillary action, centrifugal force, gravity, etc. and the cycle repeats. The second vapor chamber segment 110 can include the vapor wall portion 708 and the non-vapor wall portion 710. Note that the third vapor chamber segments 116, the fourth vapor chamber segment 118, the fifth vapor chamber segment 120, and other vapor chamber segments used in the modular vapor chamber 146 will have a similar structure with a vapor wall portion 708 and a non-vapor wall portion 110 as described above with respect to the first vapor chamber segment 108 and the second vapor chamber segment 110.

The first vapor chamber segment 108 can be thermally coupled to the second vapor chamber segment 110 using vapor chamber coupling 112*a*. The vapor chamber coupling 112*a* is located in the gap or split line between the first vapor chamber segment 108 and the second vapor chamber segment 110 and helps to thermally couple the first vapor chamber segment 108 and the second vapor chamber segment 110. The vapor chamber coupling 112*a* can include a first vapor chamber extension 124 and a second vapor chamber extension 126. In an example, as illustrated in FIG. 7, the first vapor chamber extension 124 can extend from a non-vapor wall portion 710*a* of the first vapor chamber segment 108 and the second vapor chamber extension 126 can extend from a non-vapor wall portion 710*b* of the second vapor chamber segment 110. In other examples, the first vapor chamber extension 124 can extend from a vapor wall portion 708 of the first vapor chamber segment 108 and the second vapor chamber extension 126 can extend from a vapor wall portion 708 of the second vapor chamber segment 110. The extension coupling 128 can thermally couple the first vapor chamber extension 124 to the second vapor chamber extension 126. The extension coupling 128 can be solder, paste, a heat pipe, or some other means of thermally coupling together the first vapor chamber extension 124 and the second vapor chamber extension 126.

Figure 8:
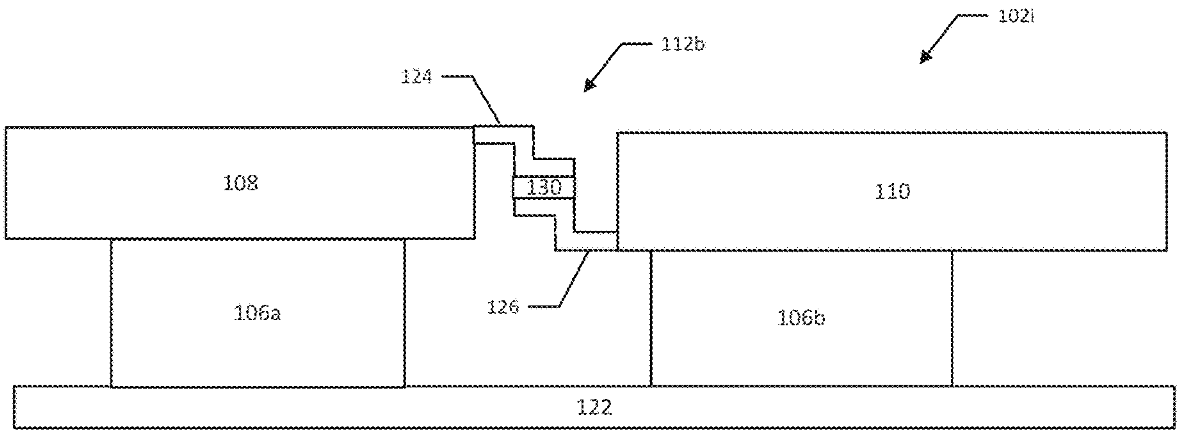
FIG. 8 is a simplified diagram illustrating examples details of a system to enable a modular vapor chamber and the connection of segments of the modular vapor chamber, in accordance with an embodiment of the present disclosure.

Turning to FIG. 8, FIG. 8 is a simplified diagram of an electronic device 102*i* configured with a modular vapor chamber and the connection of segments of the modular vapor chamber, in accordance with an embodiment of the present disclosure. In an example, the electronic device 102*i* can be the same as or similar to the electronic device 102*d*-3. More specifically, the electronic device 102*h* can include the first heat source 106*a* and the second heat source 106*b*. The first heat source 106*a* and the second heat source 106*b* can be on the support structure 122. The first vapor chamber segment 108 can be used to help move heat away from the first heat source 106*a* (e.g., to the fan 114*a*, not shown) and the second vapor chamber segment 110 can be used to help move heat away from the second heat source 106*b* (e.g., to the fan 114*b*, not shown).

In some examples, the first vapor chamber segment 108 can be thermally coupled to the second vapor chamber segment 110 using vapor chamber coupling 112*b*. The vapor chamber coupling 112*b* is located in the gap or split line between the first vapor chamber segment 108 and the second vapor chamber segment 110 and helps to thermally couple the first vapor chamber segment 108 and the second vapor chamber segment 110. The vapor chamber coupling 112*b* can include the first vapor chamber extension 124 and the second vapor chamber extension 126. In an example, the first vapor chamber extension 124 can extend from the non-vapor wall portion 710*a* (illustrated in FIG. 7) of the first vapor chamber segment 108 and the second vapor chamber extension 126 can extend from the non-vapor wall portion 710*b* (illustrated in FIG. 7) of the second vapor chamber segment 110. An extension coupling heat pipe 130 can thermally couple the first vapor chamber extension 124 to the second vapor chamber extension 126. In some examples, solder, paste, thermal glue, or some other means of thermally coupling the heat pipe 130 to the first vapor chamber extension 124 and to the second vapor chamber extension 126 may be used.

Figure 9:
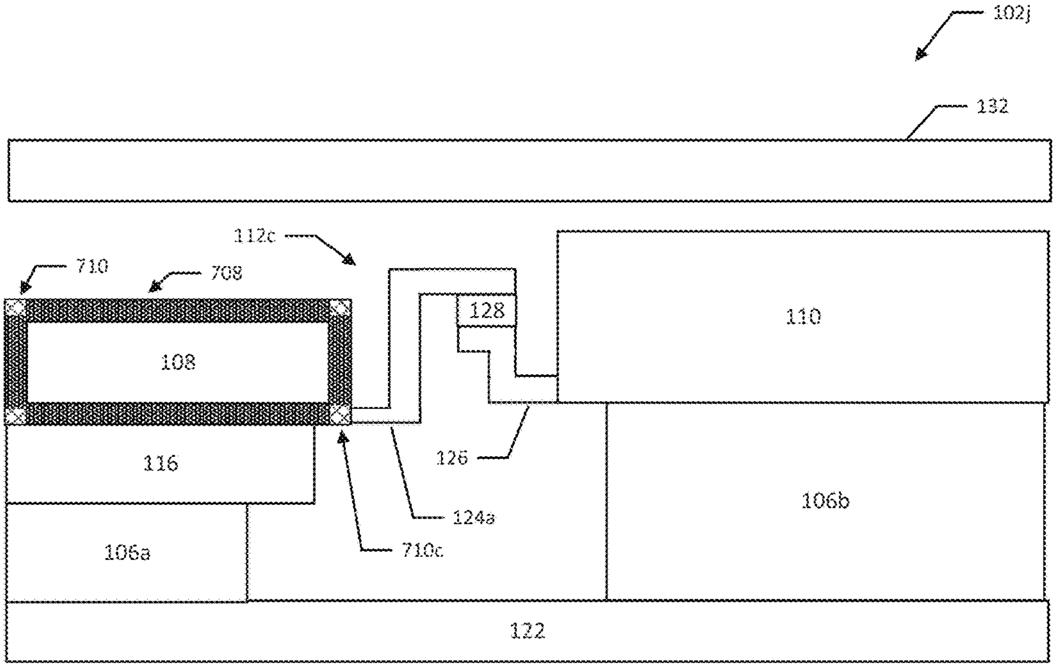
FIG. 9 is a simplified diagram illustrating examples details of a system to enable a modular vapor chamber and the connection of segments of the modular vapor chamber, in accordance with an embodiment of the present disclosure.

Turning to FIG. 9, FIG. 9 is a simplified diagram of an electronic device 102*j* configured with a modular vapor chamber and the connection of segments of the modular vapor chamber, in accordance with an embodiment of the present disclosure. In an example, the electronic device 102*j* can be the same as or similar to the electronic device 102*d*-3. More specifically, the electronic device 102*j* can include the first heat source 106*a* and the second heat source 106*b*. The first heat source 106*a* and the second heat source 106*b* can be on the support structure 122.

The first vapor chamber segment 108 and the third vapor chamber segment 116 can be used to help move heat away from the first heat source 106*a* (e.g., to the fan 114*a*, not shown) and the second vapor chamber segment 110 can be used to help move heat away from the second heat source 106*b* (e.g., to the fan 114*b*, not shown). As illustrated in FIG. 9, the first heat source 106*a* has a first height and the second heat source 106*b* has a second height that is different than the first height (e.g., the second heat source 106*b* has a greater height than the first heat source 106*a*). The third vapor chamber segment 116 can be used as a gap pad, pedestal, or riser to accommodate the difference between the first heat source 106*a* and the second heat source 106*b*. In some examples, the third vapor chamber segment 116 can be used to help create an increased gap between the first vapor chamber segment 108 and a chassis 132 of the electronic device 102*j*. The increased gap can help keep the temperature of the chassis 132 cooler as compared to the temperature of the chassis 132 if the gap was not present and the first vapor chamber segment 108 was relatively close to the chassis 132.

In addition, the first vapor chamber segment 108 can be thermally coupled to the second vapor chamber segment 110 using vapor chamber coupling 112*c*. The vapor chamber coupling 112*c* is located in the gap or split line between the first vapor chamber segment 108 and the second vapor chamber segment 110 and helps to thermally couple the first vapor chamber segment 108 and the second vapor chamber segment 110. The vapor chamber coupling 112*c* can include a first vapor chamber extension 124*a* and the second vapor chamber extension 126. In an example, the first vapor chamber extension 124*a* can extend from the non-vapor wall portion 710*c* of the first vapor chamber segment 108 and the second vapor chamber extension 126 can extend from the non-vapor wall portion 710*b* (illustrated in FIG. 7) of the second vapor chamber segment 110. The extension coupling 128 can thermally couple the first vapor chamber extension 124*a* to the second vapor chamber extension 126. In some examples, the extension coupling 128 can be replaced with the extension coupling heat pipe 130 (shown in FIG. 8). Note that while FIG. 7-9 illustrate a specific example of the vapor chamber coupling 112, other variations, alterations, and modifications of the vapor chamber coupling 112 may be used as ascertained by one skilled in the art.

Figure 10A:
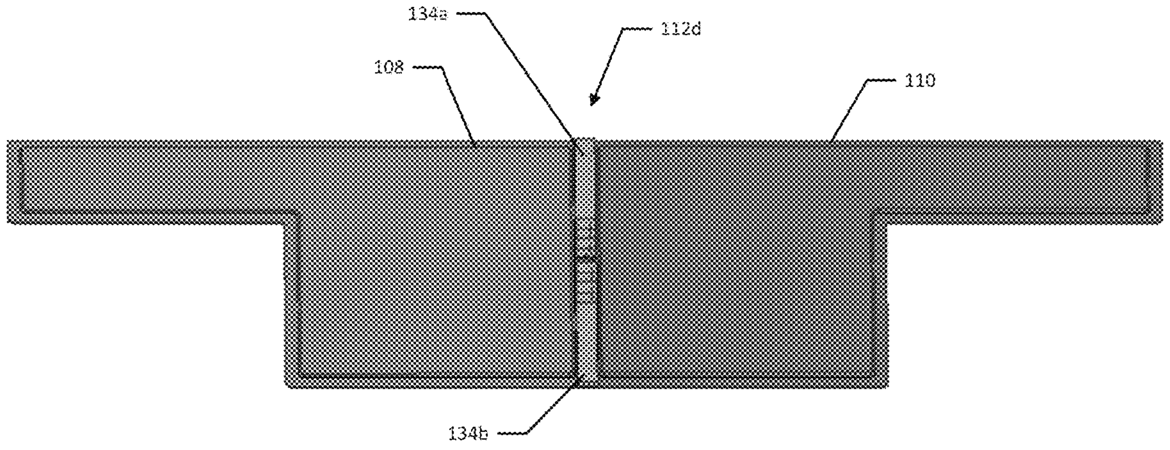
FIGS. 10A and 10B are simplified diagrams illustrating examples details of a system to enable a modular vapor chamber and the connection of segments of the modular vapor chamber, in accordance with an embodiment of the present disclosure.
Figure 10B:
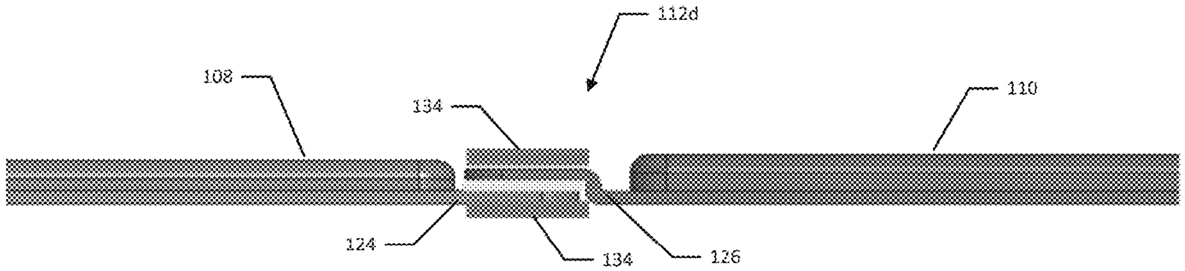

Turning to FIGS. 10A and 10B, FIGS. 10A and 10B are simplified diagrams of a vapor chamber coupling 112*d*, in accordance with an embodiment of the present disclosure. In an example, the vapor chamber coupling 112*d* can include a coupling clip 134. The coupling clip 134 can help to thermally couple the first vapor chamber segment 108 and the second vapor chamber segment 110. The coupling clip 134 can extend along the gap or split line between the first vapor chamber segment 108 and the second vapor chamber segment 110. In some examples, the coupling clip 134 extends from one end of the gap or split line between the first vapor chamber segment 108 and the second vapor chamber segment 110 to about or approximately the opposite end of the gap or split line between the first vapor chamber segment 108 and the second vapor chamber segment 110. In another example, as illustrated in FIG. 10A, a first coupling clip 134*a* extends from one end of the gap or split line between the first vapor chamber segment 108 towards a middle portion of the gap or split line and a second coupling clip 134*b* extends from a second opposite end of the gap or split line between the first vapor chamber segment 108 towards a middle portion of the gap or split line.

For example, as illustrated in FIG. 10B, the first vapor chamber segment 108 can include 124 the first vapor chamber extension 124 and the second vapor chamber segment 110 can include the second vapor chamber extension 126. In an example, the extension coupling 128 (not referenced) can thermally couple the first vapor chamber extension 124 to the second vapor chamber extension 126. In another example, an extension coupling heat pipe (e.g., the extension coupling heat pipe 130) can thermally couple the first vapor chamber extension 124 to the second vapor chamber extension 126. The coupling clip 134 can be inserted from either side of the ends of the extensions to help ensure good thermal contact between the first vapor chamber extension 124 and the second vapor chamber extension 126. In some examples, the coupling clip 134 can create an applied load on the first vapor chamber extension 124 and the second vapor chamber extension 126 to help ensure good thermal contact between the first vapor chamber extension 124 and the second vapor chamber extension 126.

Figure 11A:
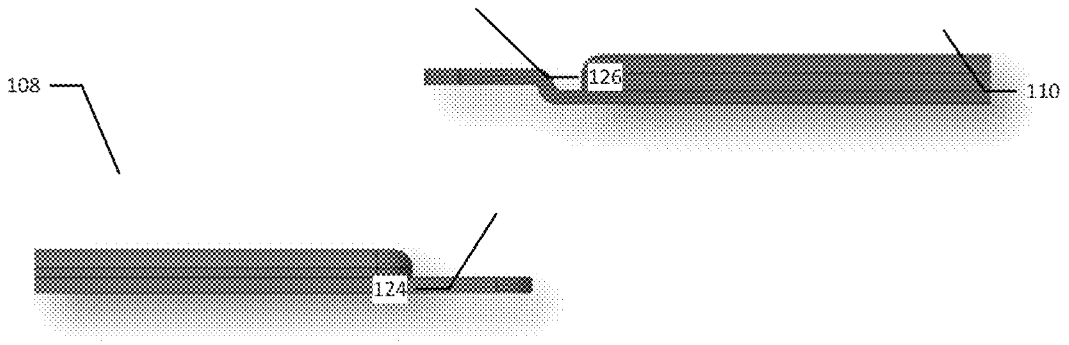
FIGS. 11A-11E are simplified diagrams illustrating examples details of a system to enable a modular vapor chamber and the connection of segments of the modular vapor chamber, in accordance with an embodiment of the present disclosure.

Turning to FIG. 11A, FIG. 11A is a simplified diagram illustrating example details of the formation of the vapor chamber coupling 112*e*, in accordance with an embodiment of the present disclosure. In an example, the first vapor chamber segment 108 can include the first vapor chamber extension 124. The second vapor chamber segment 110 can include the second vapor chamber extension 126.

Figure 11B:
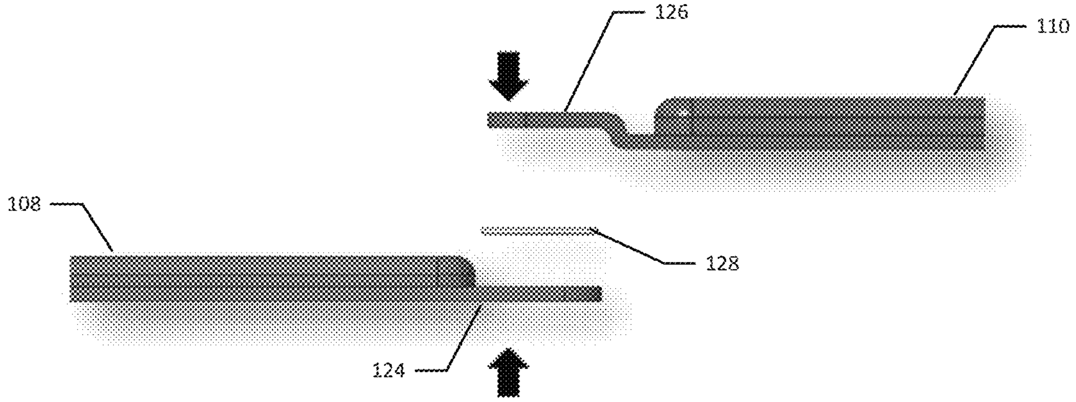

Turning to FIG. 11B, FIG. 11B is a simplified diagram illustrating example details of the formation of the vapor chamber coupling 112*e*, in accordance with an embodiment of the present disclosure. In an example, the extension coupling 128 can be located between the first vapor chamber extension 124 and the second vapor chamber extension 126. The first vapor chamber extension 124 can be moved to or positioned to couple with the second vapor chamber extension 126. The extension coupling 128 can be between the first vapor chamber extension 124 and the second vapor chamber extension 126 to thermally couple the first vapor chamber extension 124 to the second vapor chamber extension 126.

Figure 11C:
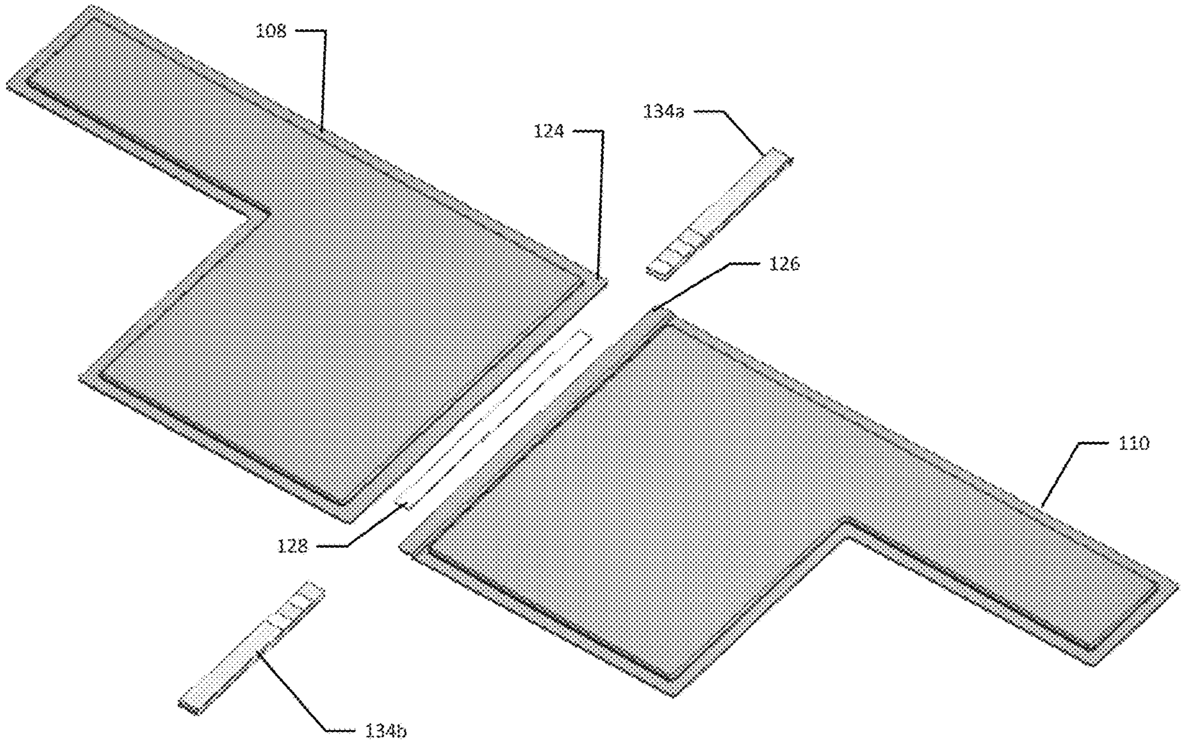

Turning to FIG. 11C, FIG. 11C is a simplified diagram illustrating example details of the formation of the vapor chamber coupling 112*e*, in accordance with an embodiment of the present disclosure. In an example, the vapor chamber coupling 112 can include the extension coupling 128 and the coupling clip 134. The extension coupling 128 can be located between the first vapor chamber extension 124 of the first vapor chamber segment 108 and the second vapor chamber extension 126 of the second vapor chamber segment 110.

Figure 11D:
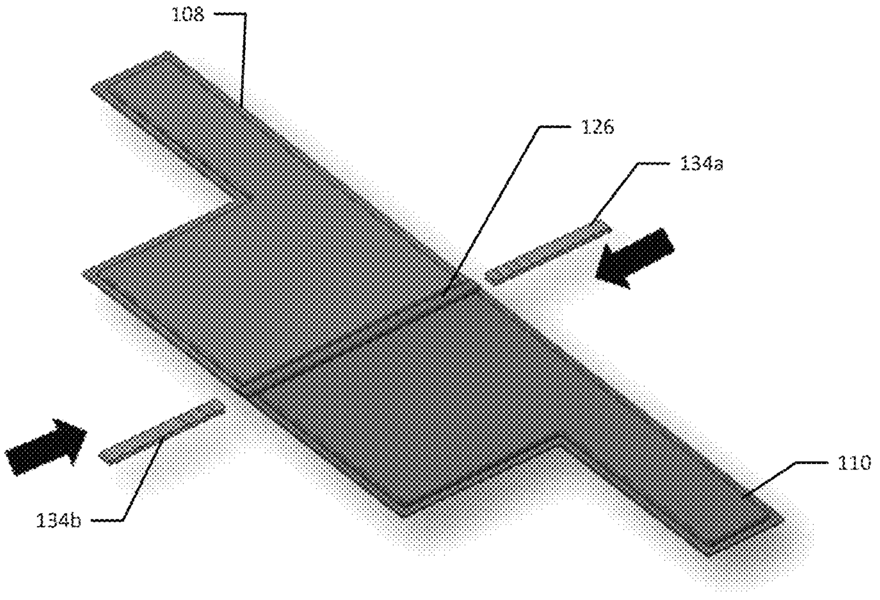

Turning to FIG. 11D, FIG. 11D is a simplified diagram illustrating example details of the formation of the vapor chamber coupling 112*e*, in accordance with an embodiment of the present disclosure. In an example, the extension coupling 128 (not shown) can be located between the first vapor chamber extension 124 (not shown) and the second vapor chamber extension 126. The first vapor chamber extension 124 can be moved to or coupled with the second vapor chamber extension 126 with the extension coupling 128 between the first vapor chamber extension 124 and the second vapor chamber extension 126 (as illustrated in FIG. 11B) to thermally couple the first vapor chamber extension 124 to the second vapor chamber extension 126. In addition, the coupling clip 134 can extend along the gap or split line between the first vapor chamber segment 108 and the second vapor chamber segment 110 to help to thermally couple the first vapor chamber segment 108 and the second vapor chamber segment 110. More specifically, as illustrated in FIG. 11D, the first coupling clip 134*a* can slide over the first vapor chamber extension 124 and the second vapor chamber extension 126 on a first side of the gap or split line between the first vapor chamber segment 108 and the second vapor chamber segment 110, towards a middle portion of the gap or split line between the first vapor chamber segment 108 and the second vapor chamber segment 110. In addition, the second coupling clip 134*b* can slide over the first vapor chamber extension 124 and the second vapor chamber extension 126 on a second side of the gap or split line between the first vapor chamber segment 108 and the second vapor chamber segment 110 towards a middle portion of the gap or split line between the first vapor chamber segment 108 and the second vapor chamber segment 110. The first side of the gap or split line between the first vapor chamber segment 108 and the second vapor chamber segment 110 is opposite the second side of the gap or split line between the first vapor chamber segment 108 and the second vapor chamber segment 110.

Figure 11E:
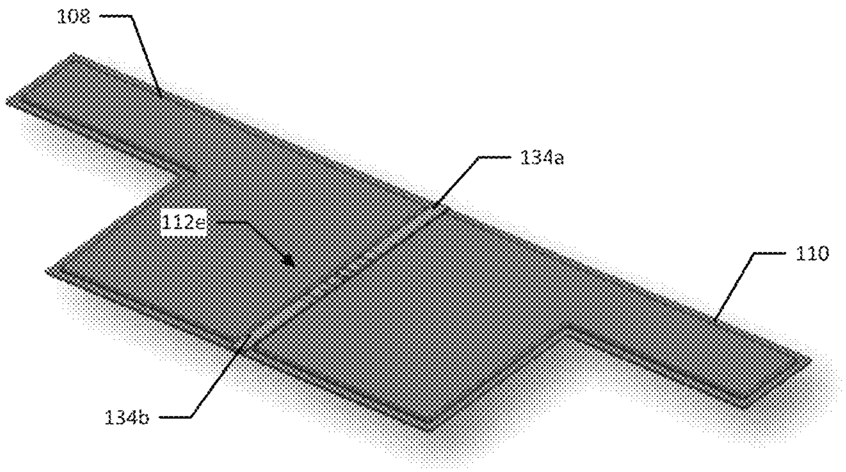

Turning to FIG. 11E, FIG. 11E is a simplified diagram illustrating example details of the formation of the vapor chamber coupling 112*e*, in accordance with an embodiment of the present disclosure. As illustrated in FIG. 11E, the first coupling clip 134*a* can slide over the first vapor chamber extension 124 and the second vapor chamber extension 126 from the first side of the gap or split line between the first vapor chamber segment 108 and the second vapor chamber segment 110 towards, a middle portion of the gap or split line between the first vapor chamber segment 108 and the second vapor chamber segment 110. In addition, the second coupling clip 134*b* can slide over the first vapor chamber extension 124 and the second vapor chamber extension 126 from the second side of the gap or split line between the first vapor chamber segment 108 and the second vapor chamber segment 110 towards a middle portion of the gap or split line between the first vapor chamber segment 108 and the second vapor chamber segment 110. The first coupling clip 134*a* and the second coupling clip 134*b* can help provide loading on the first vapor chamber extension 124 and the second vapor chamber extension 126 to help provide thermal contact between the first vapor chamber segment 108 and the second vapor chamber segment 110. In some examples, the first coupling clip 134*a* and the second coupling clip 134*b* can help can help absorb vibrations and flex to help keep the thermal contact between the first vapor chamber segment 108 and the second vapor chamber segment 110.

Figure 12:
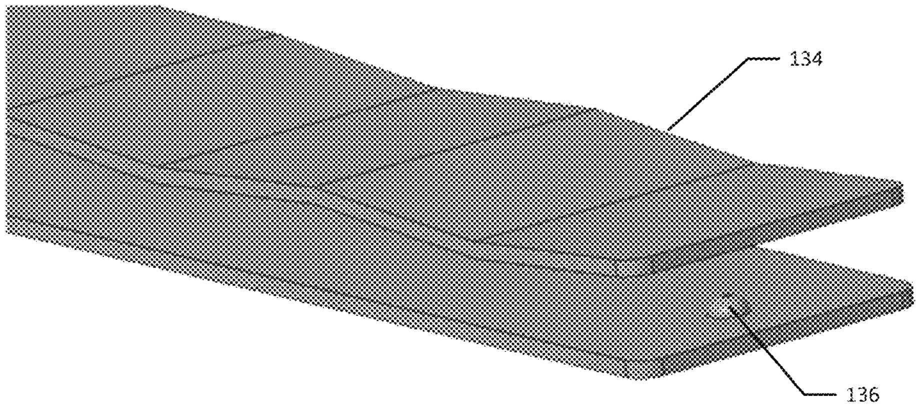
FIG. 12 is simplified diagrams illustrating examples details of a system to enable a modular vapor chamber and the connection of segments of the modular vapor chamber, in accordance with an embodiment of the present disclosure.

Turning to FIG. 12, FIG. 12 is a simplified diagram illustrating the example details of the coupling clip 134, in accordance with an embodiment of the present disclosure. In an example, the coupling clip 134 can include a friction bump 136. The friction bump 136 can help to provide a friction force on the first vapor chamber extension 124 and/or the second vapor chamber extension 126 to help keep the thermal contact between the first vapor chamber segment 108 and the second vapor chamber segment 110.

Figure 13:
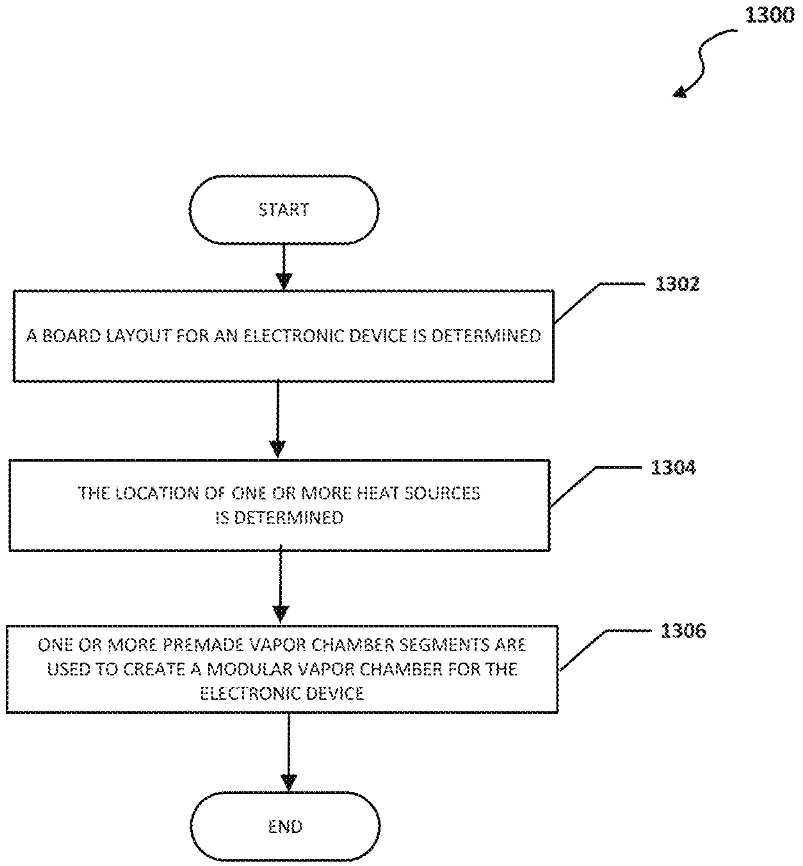
FIG. 13 is a simplified flowchart illustrating potential operations that may be associated with the system in accordance with an embodiment of the present disclosure.

Turning to FIG. 13, FIG. 13 is an example flowchart illustrating possible operations of a flow 1300 that may be associated with enabling a modular vapor chamber and the connection of segments of the modular vapor chamber, in accordance with an embodiment. At 1302, a board layout for an electronic device is determined. For example, the layout of components of an electronic device is determined. At 1304, the location of one or more heat sources is determined. For example, the location of one or more heat sources 106 can be determined. At 1306, one or more premade vapor chamber segments are used to create a modular vapor chamber for the electronic device. For example, one or more of the first vapor chamber segment 108, the second vapor chamber segment 110, the third vapor chamber segments 116, the fourth vapor chamber segment 118, and the fifth vapor chamber segment 120 are used to create a modular vapor chamber for the electronic device. If more than one of the first vapor chamber segment 108, the second vapor chamber segment 110, the third vapor chamber segments 116, the fourth vapor chamber segment 118, and the fifth vapor chamber segment 120 are used to create a modular vapor chamber for the electronic device, one or more of the vapor chamber segments can be coupled together using the vapor chamber coupling 112.

Figure 14:
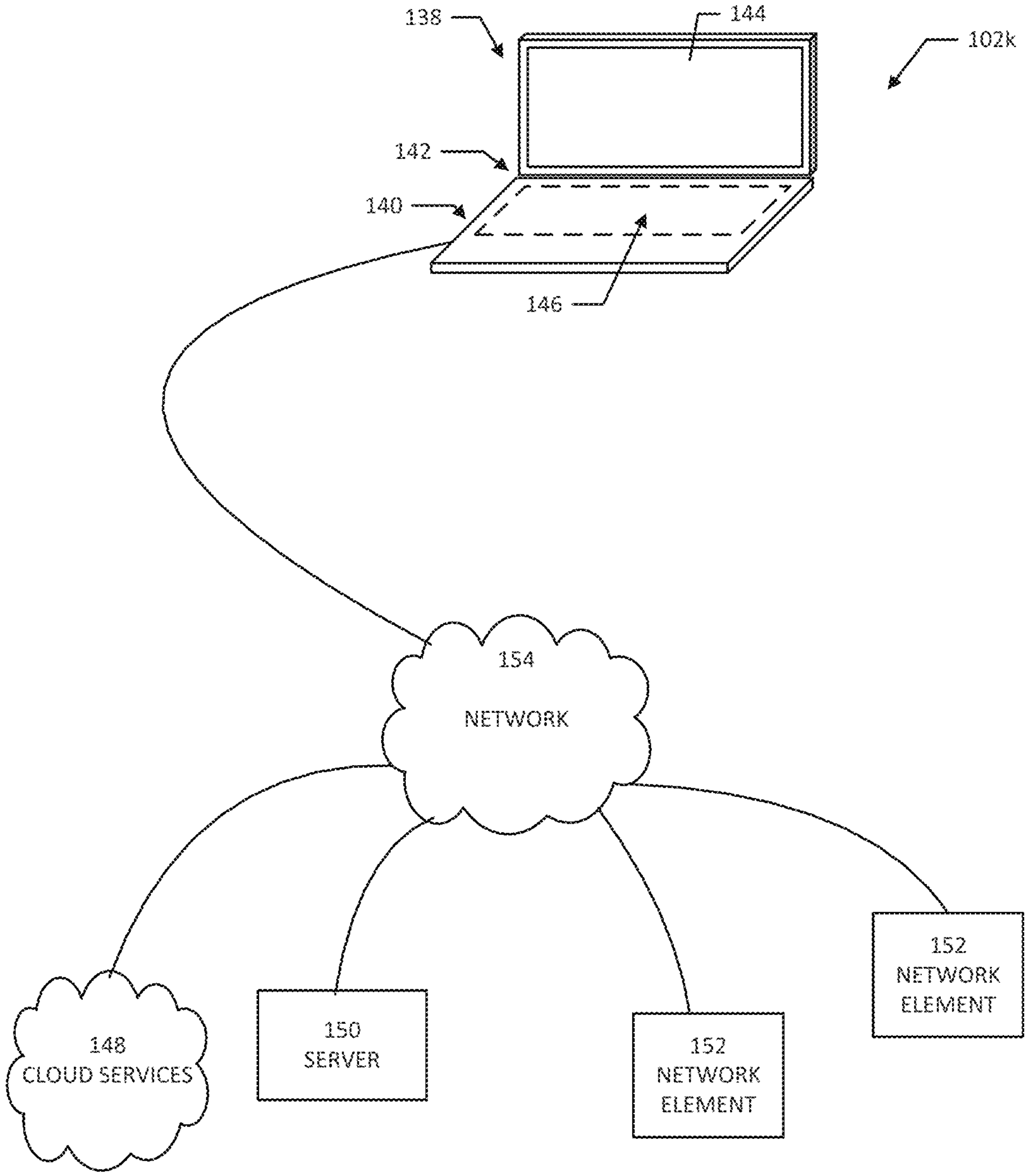
FIG. 14 is a simplified diagram simplified block diagram of a system that includes a modular vapor chamber, in accordance with an embodiment of the present disclosure.

Turning to FIG. 14, FIG. 14 is a simplified block diagram of an electronic device 102*k* configured to include a modular vapor chamber and the connection of segments of the modular vapor chamber. In an example, the electronic device 102*k* can include a first housing 138 and a second housing 140. The first housing 138 can be rotatably or pivotably coupled or connected to the second housing 140 using a hinge 142. The first housing 138 can include a display 144. The second housing can include one or more heat sources (e.g., one or more heat sources 106, not shown), and the modular vapor chamber 146. The modular vapor chamber 146 can include one or more of the first vapor chamber segment 108, the second vapor chamber segment 110 the third vapor chamber segment 116, the fourth vapor chamber segment 118, and/or the fifth vapor chamber segment 120.

The electronic device 102*k* (and electronic devices 102*a*-102*j*) may be in communication with cloud services 148, a server 150 and/or one or more network elements 152 using a network 154. In other examples, the electronic device 102*k* (and electronic devices 102*a*-102*j*) may be a standalone device and not in communication with the network 154. The network 154 represents a series of points or nodes of interconnected communication paths for receiving and transmitting packets of information. The network 154 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 154, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, the electronic devices 102*a*-102*k* are meant to encompass a computer, a personal digital assistant (PDA), a laptop or electronic notebook, hand held device, a cellular telephone, a smartphone, an IP phone, wearables, network elements, network appliances, servers, routers, switches, gateways, bridges, load balancers, processors, modules, or any other device, component, element, or object that includes a heat source and can allow for a modular vapor chamber and the connection of segments of the modular vapor chamber. Each of electronic devices 102*a*-102*k* may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of the electronic devices 102*a*-102*k* may include virtual elements.

In regards to the internal structure, each of the electronic devices 102*a*-102*k* can include memory elements for storing information to be used in operations. Each of the electronic devices 102*a*-102*k* may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

In an example implementation, elements of the electronic devices 102*a*-102*k* may include software modules to achieve, or to foster, operations. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, each of the electronic devices 102*a*-102*k* can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

It is also important to note that the preceding diagrams illustrate only some of the possible scenarios and patterns that may be executed by, or within, the electronic devices 102*a*-102*k*. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. Substantial flexibility is provided by the electronic devices 102*a*-102*k* in that any suitable arrangements, chronologies, configurations, and timing mechanisms may be provided without departing from the teachings of the present disclosure.

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that the electronic devices 102*a*-102*k* and their teachings are readily scalable and can accommodate a large number of components, as well as more complicated/sophisticated arrangements and configurations. Accordingly, the examples provided should not limit the scope or inhibit the broad teachings of the electronic devices 102*a*-102*k* and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the electronic devices 102*a*-102*k* have been illustrated with reference to particular elements and operations, these elements and operations may be replaced by any suitable architecture, protocols, and/or processes that achieve the intended functionality of the electronic devices 102*a*-102*k*.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device includes a first heat source, a second heat source, and a modular vapor chamber. The module vapor chamber includes a first vapor chamber segment over the first heat source, a second vapor chamber segment over the second heat source, where a gap is between the first vapor chamber segment and the second vapor chamber segment, and vapor chamber coupling located in the gap to thermally couple the first vapor chamber segment and the second vapor chamber segment.

In Example A2, the subject matter of Example A1 can optionally include where the vapor chamber coupling extends from a non-vapor wall portion of the first vapor chamber segment and/or the second vapor chamber segment.

In Example A3, the subject matter of Example A2 can optionally include where the vapor chamber coupling includes solder, paste, or thermal glue.

In Example A4, the subject matter of Example A3 can optionally include where the vapor chamber coupling includes a heat pipe.

In Example A5, the subject matter of Example A4 can optionally include where the vapor chamber coupling includes a coupling clip.

In Example A6, the subject matter of Example A5 can optionally include where the coupling clip includes a friction bump.

In Example A7, the subject matter of Example A1 can optionally include a first coupling clip that extends from a first edge of the modular vapor chamber to a middle portion of the modular vapor chamber and a second coupling clip that extends from a second edge of the modular vapor chamber to the middle portion of the modular vapor chamber.

In Example A8, the subject matter of Example A1 can optionally include where the first vapor chamber segment is over a computer processing unit and the second vapor chamber segment is over a graphics processing unit.

In Example A9, the subject matter of any of Examples A1-A2 can optionally include where the vapor chamber coupling includes solder, paste, or thermal glue.

In Example A10, the subject matter of any of Examples A1-A3 can optionally include where the vapor chamber coupling includes a heat pipe.

In Example A11, the subject matter of any of Examples A1-A4 can optionally include where the vapor chamber coupling includes a coupling clip.

In Example A12, the subject matter of any of Examples A1-A5 can optionally include where the coupling clip includes a friction bump.

In Example A13, the subject matter of any of Examples A1-A6 can optionally include a first coupling clip that extends from a first edge of the modular vapor chamber to a middle portion of the modular vapor chamber and a second coupling clip that extends from a second edge of the modular vapor chamber to the middle portion of the modular vapor chamber.

In Example A14, the subject matter of any of Examples A1-A7 can optionally include where the first vapor chamber segment is over a computer processing unit and the second vapor chamber segment is over a graphics processing unit.

Example AA1 is a modular vapor chamber system including a first vapor chamber segment having a first profile, a second vapor chamber segment, where the second vapor chamber segment has a second profile that is different than the first profile of the first vapor chamber segment, a third vapor chamber segment, where the third vapor chamber segment has a third profile that allows the third vapor chamber segment to function as a pedestal or a gap pad, a fourth vapor chamber segment, where the fourth vapor chamber segment has a profile that is different that the first profile of the first vapor chamber segment, the second profile of the second vapor chamber segment, and the third profile of the third vapor chamber segment, and vapor chamber coupling to thermally couple at least two of the first vapor chamber segment, the second vapor chamber segment, the third vapor chamber segment, and the fourth vapor chamber segment.

In Example AA2, the subject matter of Example AA1 can optionally include where the first vapor chamber segment and the second vapor chamber segment are coupled together using the vapor chamber coupling and used in a first electronic device, where the first electronic device includes a central processing unit and a graphics processing unit.

In Example AA3, the subject matter of Example AA2 can optionally include where the first vapor chamber segment, the second vapor chamber segment, and the third vapor chamber segment are used in a second electronic device, where the second electronic device includes the central processing unit and the graphics processing unit.

In Example AA4, the subject matter of Example AA3 can optionally include where the central processing unit has a height that is lower than a height of the graphics processing unit.

In Example AA5, the subject matter of Example AA3 can optionally include where the third vapor chamber segment is used to accommodate a height difference between the central processing unit and the graphics processing unit.

In Example AA6, the subject matter of Example AA1 can optionally include where the vapor chamber coupling extends from a non-vapor wall portion of the first vapor chamber segment and/or the second vapor chamber segment.

In Example AA7, the subject matter of Example AA1 can optionally include where the vapor chamber coupling includes at least one coupling clip.

In Example AA8, the subject matter of any of the Examples AA1-AA2 can optionally include where the first vapor chamber segment, the second vapor chamber segment, and the third vapor chamber segment are used in a second electronic device, where the second electronic device includes the central processing unit and the graphics processing unit.

In Example AA9, the subject matter of any of the Examples AA1-AA3 can optionally include where the central processing unit has a height that is lower than a height of the graphics processing unit.

In Example AA10, the subject matter of any of the Examples AA1-AA4 can optionally where the third vapor chamber segment is used to accommodate a height difference between the central processing unit and the graphics processing unit.

In Example AA11, the subject matter of any of the Examples AA1-AA5 can optionally include where the vapor chamber coupling extends from a non-vapor wall portion of the first vapor chamber segment and/or the second vapor chamber segment.

In Example AA12, the subject matter of any of the Examples AA1-AA6 can optionally include where the vapor chamber coupling includes at least one coupling clip.

Example M1 is a method including determining a board layout for an electronic device and identifying one or more heat sources, creating a modular vapor chamber using two or more premade vapor chamber segments, and thermally coupling the two or more premade vapor chamber segments together to create the modular vapor chamber.

In Example M2, the subject matter of Example M1 can optionally include where the one or more premade vapor chamber segments include a first vapor chamber segment having a first profile, and a second vapor chamber segment, where the second vapor chamber segment has a second profile that is a mirror image of the first profile of the first vapor chamber segment.

In Example M3, the subject matter of Example M2 can optionally include thermally coupling the first vapor chamber segment and the second vapor chamber segment using a vapor chamber coupling.

In Example M4, the subject matter of Example M3 can optionally include where the vapor chamber coupling includes a heat pipe.

In Example M5, the subject matter of Example M1 can optionally include where the vapor chamber coupling includes at least one coupling clip.

In Example M6, the subject matter of any of the Examples M1-M2 can optionally include thermally coupling the first vapor chamber segment and the second vapor chamber segment using a vapor chamber coupling.

In Example M7, the subject matter of any of the Examples M1-M3 can optionally include where the vapor chamber coupling includes a heat pipe.

In Example M8, the subject matter of any of the Examples M1-M4 can optionally include where the vapor chamber coupling includes at least one coupling clip.

What is claimed is:

1. An electronic device comprising:
- a first heat source;
- a second heat source; and
- a modular vapor chamber, wherein the module vapor chamber includes:
  - a first vapor chamber segment over the first heat source;
  - a second vapor chamber segment over the second heat source, wherein a gap is between the first vapor chamber segment and the second vapor chamber segment; and
  - a vapor chamber coupling located in the gap to thermally couple the first vapor chamber segment and the second vapor chamber segment, wherein the vapor chamber coupling includes a first vapor chamber extension extending from the first vapor chamber segment and a second vapor chamber extension extending from the second vapor chamber segment, and an extension coupling that thermally couples the first vapor chamber extension to the second vapor chamber extension.

2. The electronic device of claim 1, wherein the vapor chamber coupling extends from a non-vapor wall portion of the first vapor chamber segment and/or the second vapor chamber segment.

3. The electronic device of claim 1, wherein the vapor chamber coupling includes solder, paste, or thermal glue.

4. The electronic device of claim 1, wherein the vapor chamber coupling includes a heat pipe.

5. The electronic device of claim 1, wherein the vapor chamber coupling includes a coupling clip.

6. The electronic device of claim 5, wherein the coupling clip includes a friction bump.

7. The electronic device of claim 1, wherein the vapor chamber coupling includes:
- a first coupling clip that extends from a first edge of the modular vapor chamber to a middle portion of the modular vapor chamber; and
- a second coupling clip that extends from a second edge of the modular vapor chamber to the middle portion of the modular vapor chamber.

8. The electronic device of claim 1, wherein the first vapor chamber segment is over a computer processing unit and the second vapor chamber segment is over a graphics processing unit.

9. A modular vapor chamber system comprising:
- a first vapor chamber segment having a first profile;
- a second vapor chamber segment, wherein the second vapor chamber segment has a second profile that is different than the first profile of the first vapor chamber segment;
- a third vapor chamber segment, wherein the third vapor chamber segment has a third profile that allows the third vapor chamber segment to function as a pedestal or a gap pad;
- a fourth vapor chamber segment, wherein the fourth vapor chamber segment has a profile that is different than the first profile of the first vapor chamber segment, the second profile of the second vapor chamber segment, and the third profile of the third vapor chamber segment; and
- a vapor chamber coupling to thermally couple at least two of the first vapor chamber segment, the second vapor chamber segment, the third vapor chamber segment, and the fourth vapor chamber segment, wherein the vapor chamber coupling includes a first vapor chamber extension extending from the first vapor chamber segment and a second vapor chamber extension extending from the second vapor chamber segment, and an extension coupling that thermally couples the first vapor chamber extension to the second vapor chamber extension.

10. The modular vapor chamber system of claim 9, wherein the first vapor chamber segment and the second vapor chamber segment are coupled together using the vapor chamber coupling and used in a first electronic device, wherein the first electronic device includes a central processing unit and a graphics processing unit.

11. The modular vapor chamber system of claim 9, wherein the first vapor chamber segment, the second vapor chamber segment, and the third vapor chamber segment are used in a second electronic device, wherein the second electronic device includes a central processing unit and a graphics processing unit.

12. The modular vapor chamber system of claim 11, wherein the central processing unit has a height that is lower than a height of the graphics processing unit.

13. The modular vapor chamber system of claim 11, wherein the third vapor chamber segment is used to accommodate a height difference between the central processing unit and the graphics processing unit.

14. The modular vapor chamber system of claim 9, wherein the vapor chamber coupling extends from a non-vapor wall portion of the first vapor chamber segment and/or the second vapor chamber segment.

15. The modular vapor chamber system of claim 9, wherein the vapor chamber coupling includes at least one coupling clip.

16. A method comprising:

determining a board layout for an electronic device and identifying one or more heat sources;

creating a modular vapor chamber using two or more pre made vapor chamber segments; and thermally coupling the two or more pre made vapor chamber segments together to create the modular vapor chamber, wherein thermally coupling the two or more pre made vapor chamber segments includes coupling a first vapor chamber extension extending from a first pre made vapor chamber segment to a second vapor chamber extension extending from a second pre made vapor chamber segment, wherein the first vapor chamber extension is thermally coupled to the second vapor chamber extension using an extension coupling.

17. The method of claim 16, wherein the one two or more premade vapor chamber segments include:

a first vapor chamber segment having a first profile; and a second vapor chamber segment, wherein the second vapor chamber segment has a second profile that is a mirror image of the first profile of the first vapor chamber segment.

18. The method of claim 17, further comprising:

thermally coupling the first vapor chamber segment and the second vapor chamber segment using a vapor chamber coupling.

19. The method of claim 18, wherein the vapor chamber coupling includes a heat pipe.

20. The method of claim 18, wherein the vapor chamber coupling includes at least one coupling clip.

* * * * *